(12) United States Patent
Yang et al.

(10) Patent No.: US 12,157,848 B2
(45) Date of Patent: Dec. 3, 2024

(54) QUANTUM DOT HAVING A PHOSPHORUS PRECURSOR IN A MULTI-COMPONENT CORE

(71) Applicant: SAMSUNG ELECTRONICS CO., LTD., Suwon-si (KR)

(72) Inventors: Hyeyeon Yang, Suwon-si (KR); Garam Park, Seoul (KR); Shin Ae Jun, Seongnam-si (KR); Tae Gon Kim, Hwaseong-si (KR); Taekhoon Kim, Hwaseong-si (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 168 days.

(21) Appl. No.: 18/074,570

(22) Filed: Dec. 5, 2022

(65) Prior Publication Data

US 2023/0121293 A1    Apr. 20, 2023

Related U.S. Application Data

(62) Division of application No. 16/914,598, filed on Jun. 29, 2020, now Pat. No. 11,530,353.

(30) Foreign Application Priority Data

Jun. 28, 2019  (KR) .................. 10-2019-0078387

(51) Int. Cl.
*C09K 11/70*   (2006.01)
*C09K 11/02*   (2006.01)
(Continued)

(52) U.S. Cl.
CPC ............. *C09K 11/70* (2013.01); *C09K 11/02* (2013.01); *C09K 11/0811* (2013.01);
(Continued)

(58) Field of Classification Search
CPC ........ B82Y 20/00; B82Y 40/00; H10K 59/38; H10K 59/12; G02F 1/133617;
(Continued)

(56) References Cited

U.S. PATENT DOCUMENTS 9,637,683 B2    5/2017  Lee et al.
10,066,161 B2   9/2018  Curley et al.
(Continued)

FOREIGN PATENT DOCUMENTS

CN    106701059 A    5/2017
CN    107338048 A    11/2017
(Continued)

OTHER PUBLICATIONS

Francesca Pietra et al., "Ga for Zn Cation Exchange Allows for Highly Luminescent and Photostable InZnP-Based Quantum Dots," Chemistry of Materials, Jun. 6, 2017, pp. 5192-5199, vol. 29, DOI: 10.1021/acs.chemmater.7b00848.
(Continued)

*Primary Examiner* — Alonzo Chambliss
(74) *Attorney, Agent, or Firm* — CANTOR COLBURN LLP

(57) ABSTRACT

A quantum dot including a multi-component core including a first semiconductor nanocrystal including indium (In), zinc (Zn), and phosphorus (P) and a second semiconductor nanocrystal disposed on the first semiconductor nanocrystal, the second semiconductor nanocrystal including gallium (Ga) and phosphorus (P) wherein the quantum dot is cadmium-free and emits green light, a mole ratio (P:In) of phosphorus relative to indium is greater than or equal to about 0.6:1 and less than or equal to about 1.0, and a mole ratio (P:(In+Ga)) of phosphorus relative to indium and gallium is greater than or equal to about 0.5:1 and less than
(Continued)

or equal to about 0.8:1, a quantum dot-polymer composite pattern including the same, and a display device.

20 Claims, 5 Drawing Sheets

(51) Int. Cl.
*C09K 11/08* (2006.01)
*C09K 11/54* (2006.01)
*C09K 11/56* (2006.01)
*C09K 11/62* (2006.01)
*G02F 1/017* (2006.01)
*G02F 1/13357* (2006.01)
*H10K 59/12* (2023.01)
*H10K 59/38* (2023.01)
*B82Y 20/00* (2011.01)
*B82Y 40/00* (2011.01)

(52) U.S. Cl.
CPC ......... *C09K 11/0883* (2013.01); *C09K 11/54* (2013.01); *C09K 11/565* (2013.01); *C09K 11/623* (2013.01); *C09K 11/703* (2013.01); *G02F 1/01791* (2021.01); *G02F 1/133617* (2013.01); *H10K 59/12* (2023.02); *H10K 59/38* (2023.02); *B82Y 20/00* (2013.01); *B82Y 40/00* (2013.01)

(58) Field of Classification Search
CPC . G02F 1/01791; C09K 11/54; C09K 11/0811; C09K 11/70; C09K 11/0883; C09K 11/02; C09K 11/62; C09K 11/565; C09K 11/703; C09K 11/623
See application file for complete search history.

(56) References Cited

U.S. PATENT DOCUMENTS

| | | | |
|---|---|---|---|
| 10,162,259 B2 | 12/2018 | Nam et al. | |
| 10,364,391 B2 | 7/2019 | Jang et al. | |
| 10,450,507 B2 | 10/2019 | Jang et al. | |
| 10,852,587 B2* | 12/2020 | Nam | G02F 1/133602 |
| 11,180,695 B2* | 11/2021 | Kim | C09K 11/565 |
| 11,365,348 B2* | 6/2022 | Park | G02B 6/005 |
| 11,530,353 B2* | 12/2022 | Yang | C09K 11/70 |
| 11,725,142 B2* | 8/2023 | Jung | C09K 11/565 |
| | | | 252/301.6 S |
| 2008/0246388 A1 | 10/2008 | Kwang-Ohk et al. | |
| 2011/0315954 A1 | 12/2011 | Jang et al. | |
| 2014/0117292 A1* | 5/2014 | Jun | H01L 31/035218 |
| | | | 252/519.14 |
| 2019/0276737 A1* | 9/2019 | Won | H10K 50/171 |
| 2019/0362656 A1 | 11/2019 | Saitoh et al. | |
| 2020/0325395 A1 | 10/2020 | Curley et al. | |

FOREIGN PATENT DOCUMENTS

| | | |
|---|---|---|
| CN | 108384531 A | 8/2018 |
| JP | 2018128590 A | 8/2018 |
| KR | 20130022639 A | 3/2013 |
| KR | 20130080333 A | 7/2013 |
| KR | 1355120 B1 | 1/2014 |
| KR | 20140121217 A | 10/2014 |
| KR | 20150111307 A | 10/2015 |
| KR | 20160091523 A | 8/2016 |
| KR | 20170026963 A | 3/2017 |
| KR | 1739751 B1 | 5/2017 |
| KR | 1797366 B1 | 11/2017 |
| KR | 20180016196 A | 2/2018 |
| KR | 20180030353 A | 3/2018 |
| KR | 1852459 B1 | 4/2018 |
| KR | 20180088552 A | 8/2018 |

OTHER PUBLICATIONS

Joong Pill Park et al., "Highly luminescent InP/GaP/ZnS QDs emitting in the entire color range via a heating up process," Nature, Scientific Reports, Jul. 20, 2016, pp. 1-6, DOI: 10.1038/srep30094.

Sungwoo Kim et al., "Highly Luminescent InP/GaP/ZnS Nanocrystals and Their Application to White Light-Emitting Diodes," Journal of the American Chemical Society, Oct. 5, 2018, pp. 3804-3809, vol. 134.

V. M. Menon et al., "Lasing from InGaP quantum dots in a spin-coated flexible microcavity," Optics Express, Nov. 11, 2008, pp. 19535-19540, vol. 16, No. 24.

* cited by examiner

Pattern Preparation by using a photoresist

Repeating the Patterning Process three times

QUANTUM DOT HAVING A PHOSPHORUS PRECURSOR IN A MULTI-COMPONENT CORE

CROSS-REFERENCE TO RELATED APPLICATION

This application is a divisional application of application Ser. No. 16/914,598, filed Jun. 29, 2020, which claims priority to and the benefit of Korean Patent Application No. 10-2019-0078387 filed in the Korean Intellectual Property Office on Jun. 28, 2019, and all the benefits accruing therefrom under 35 U.S.C. § 119, the entire content of which in its entirety is herein incorporated by reference.

BACKGROUND

1. Field

A cadmium-free quantum dot and a composite and a display device including the same are disclosed.

2. Description of the Related Art

Quantum dots (i.e., nano-sized semiconductor nanocrystals) may have different bandgap energies by controlling sizes and compositions of nanocrystals, unlike bulk materials. Quantum dots may exhibit electroluminescence and photoluminescence properties. In a chemical wet process, organic materials such as dispersing agents are coordinated on, e.g., to, the surface of the semiconductor nanocrystal during a crystal growth to provide quantum dots having controlled sizes and photoluminescence characteristics. Light emitting properties of quantum dots may be applied, e.g., used, in various fields. From an environmental point of view, it is desirable to develop quantum dots that can realize, e.g., provide, improved light emitting properties and are free of noxious heavy metals such as cadmium or lead, and the like.

SUMMARY

An embodiment provides a quantum dot capable of exhibiting improved light emitting properties (e.g., excitation light absorption rate).

An embodiment provides a composition including the quantum dot(s).

An embodiment provides a quantum dot-polymer composite including the quantum dot(s).

An embodiment provides a stacked structure and a display device that include the quantum dot-polymer composite.

In an embodiment, a quantum dot includes a multi-component core including a first semiconductor nanocrystal including indium (In), zinc (Zn), and phosphorus (P), and a second semiconductor nanocrystal disposed on the first semiconductor nanocrystal, the second semiconductor nanocrystal including gallium (Ga) and phosphorus (P), wherein the quantum dot is cadmium-free and emits green light, a mole ratio (P:In) of phosphorus relative to indium is greater than or equal to about 0.6 and less than or equal to about 1.0:1, and a mole ratio (P:(In+Ga)) of phosphorus relative to a sum of indium and gallium is greater than or equal to about 0.5:1 and less than or equal to about 0.8:1.

The quantum dot may have optical density at a wavelength of about 450 nanometers (nm) per gram (g) of greater than or equal to about 1,100, for example, greater than or equal to about 1,200, greater than or equal to about 1,300, greater than or equal to about 1,400, greater than or equal to about 1,450, greater than or equal to about 1,500, greater than or equal to about 1,550, greater than or equal to about 1,600, greater than or equal to about 1,650, greater than or equal to about 1,700, greater than or equal to about 1,750, greater than or equal to about 1,800, or greater than or equal to about 1,850, when a first absorption peak in the ultraviolet-visible (UV-Vis) absorption spectrum is less than or equal to about 440 nm.

The maximum emission peak of the green light may be in a wavelength range of greater than or equal to about 500 nm, for example, greater than or equal to about 510 nm, greater than or equal to about 520 nm, or greater than or equal to about 525 nm.

The maximum emission peak of the green light may be in a wavelength range of less than or equal to about 560 nm, for example, less than or equal to about 550 nm, less than or equal to about 545 nm, less than or equal to about 540 nm, or less than or equal to about 535 nm.

The quantum dot may have a ratio (450:350) of intensity at 450 nm relative to intensity at 350 nm of greater than or equal to about 0.5:1 in the UV-Vis absorption spectrum. In an embodiment, the quantum dot may have a ratio of intensity at a wavelength of about 450 nm relative to an intensity at a wavelength of about 350 nm of greater than or equal to about 0.08:1 in the UV-Vis absorption spectrum. The quantum dot may have a ratio of intensity at a wavelength of about 450 nm relative to an intensity at a wavelength of about 350 nm of greater than or equal to about 0.09:1 in the UV-Vis absorption spectrum.

The quantum dot may have a mole ratio of phosphorus relative to indium of greater than or equal to about 0.72:1.

The quantum dot may have a mole ratio of phosphorus relative to indium of less than or equal to about 0.89:1.

The quantum dot may have a mole ratio of phosphorus relative to indium of less than or equal to about 0.86:1.

The quantum dot may have a mole ratio of phosphorus relative to a sum of indium and gallium of greater than or equal to about 0.6:1.

The quantum dot may have a mole ratio of phosphorus relative to a sum of indium and gallium of less than or equal to about 0.79:1.

When a first absorption peak in the UV-Vis absorption spectrum of the quantum dot is less than or equal to about 440 nm, the quantum dot may have a mole ratio (P:(Zn+In+Ga)) of phosphorus relative to a sum of indium, zinc, and gallium of greater than or equal to about 0.2:1 and less than about 0.77:1.

When a first absorption peak in the UV-Vis absorption spectrum of the quantum dot is less than or equal to about 440 nm, the quantum dot may have a mole ratio ((Zn+Ga):In) of a sum of zinc and gallium relative to indium of less than about 0.75:1.

The diameter of the multi-component core may be greater than or equal to about 2.3 nm.

The diameter of the multi-component core may be less than or equal to about 3.0 nm.

The quantum dot may have a semiconductor nanocrystal shell disposed on the multi-component core, the semiconductor nanocrystal shell including zinc, and sulfur, selenium, or a combination thereof (e.g., zinc, sulfur, and selenium).

The quantum dot may include a first semiconductor nanocrystal shell disposed on the multi-component core, the first semiconductor nanocrystal shell including zinc and selenium, and a second semiconductor nanocrystal shell disposed on the first shell, the second semiconductor nanocrystal shell including zinc and sulfur.

The first semiconductor nanocrystal shell may be disposed directly on the semiconductor nanocrystal core.

The first semiconductor nanocrystal shell may not include sulfur (S).

The second semiconductor nanocrystal shell may be disposed directly on the first semiconductor nanocrystal shell.

The second semiconductor nanocrystal shell may be an outermost layer of the quantum dot.

The thickness of the first semiconductor nanocrystal shell may be 3 monolayer or more.

The thickness of the first semiconductor nanocrystal shell may be greater than or equal to about 0.9 nm.

The thickness of the first semiconductor nanocrystal shell may be less than or equal to about 2.5 nm.

The thickness of the first semiconductor nanocrystal shell may be less than or equal to about 1.5 nm.

The thickness of the second semiconductor nanocrystal shell may be less than about 0.7 nm.

The thickness of the second semiconductor nanocrystal shell may be less than or equal to about 0.6 nm.

The quantum dot may have a mole ratio of zinc relative to a sum of indium and gallium of greater than or equal to about 8:1, greater than or equal to about 9:1, greater than or equal to about 10:1, greater than or equal to about 12:1, greater than or equal to about 15:1, or greater than or equal to about 20:1.

The quantum dot may have a mole ratio of zinc relative to a sum of indium and gallium of less than or equal to about 45:1, less than or equal to about 42:1, less than or equal to about 40:1, or less than or equal to about 36:1.

The quantum dot may have a mole ratio of zinc relative to a sum of indium and gallium of greater than or equal to about 10:1 and less than or equal to about 45:1.

The quantum dot may have a mole ratio of sulfur relative to selenium of less than or equal to about 2.5:1, for example, less than or equal to about 2:1, less than or equal to about 1.4:1, less than or equal to about 1.2:1, less than or equal to about 1:1, less than or equal to about 0.9:1, less than or equal to about 0.8:1, less than or equal to about 0.7:1, less than or equal to about 0.6:1, or less than or equal to about 0.5:1.

The quantum dot may have a mole ratio of sulfur relative to selenium of greater than or equal to about 0.1:1, greater than or equal to about 0.3:1, greater than or equal to about 0.5:1, greater than or equal to about 0.7:1, greater than or equal to about 0.9:1, or greater than or equal to about 1:1.

The quantum dot may have a mole ratio of a sum of indium and gallium relative to a sum of selenium and sulfur of greater than or equal to about 0.01:1, greater than or equal to about 0.02:1, greater than or equal to about 0.03:1, greater than or equal to about 0.04:1, greater than or equal to about 0.05:1, greater than or equal to about 0.07:1, greater than or equal to about 0.09:1, or greater than or equal to about 0.1:1.

The quantum dot may have a mole ratio of a sum of indium and gallium relative to a sum of selenium and sulfur of less than or equal to about 0.2:1, less than or equal to about 0.15:1, less than or equal to about 0.1:1, or less than or equal to about 0.06:1.

The quantum dot may have a quantum efficiency of greater than or equal to about 60% or greater than or equal to about 65%.

The quantum dot may have a full width at half maximum (FWHM) of less than or equal to about 100 nm.

The quantum dot may have a full width at half maximum (FWHM) of less than or equal to about 50 nm.

The quantum dot may have a full width at half maximum (FWHM) of less than or equal to about 45 nm.

A size (average size) of the quantum dot may be greater than or equal to about 5 nm, greater than or equal to about 5.5 nm, greater than or equal to about 6 nm, or greater than or equal to about 6.5 nm.

A size (average size) of the quantum dot may be less than or equal to about 10 nm, less than or equal to about 9 nm, less than or equal to about 8 nm, or less than or equal to about 7 nm.

In an embodiment, a method of producing the quantum dot includes forming the multi-component core, wherein the forming of the multi-component core includes
  reacting an indium precursor with a phosphorus precursor at a first reaction temperature in an organic solvent in the presence of an organic ligand to form particles including a first semiconductor nanocrystal;
  adding a zinc precursor to the particles comprising a first semiconductor nanocrystal at a temperature equal to or less than the first reaction temperature to form a zinc-containing coating on a surface of the particles including the first semiconductor nanocrystal and provide a reaction system comprising the particles on which the zinc-containing coating is formed; and
  adding a gallium precursor and a phosphorus precursor to the reaction system while heating the reaction system to a second reaction temperature to form a second semiconductor nanocrystal on the first semiconductor nanocrystal and produce the quantum dot,
  wherein the second reaction temperature is higher than the first reaction temperature.

The particles including the first semiconductor nanocrystal may be greater than or equal to about 0.9 nm and less than or equal to about 2.1 nm.

The forming of the multi-component core may be performed by one-pot synthesis without separation of the produced particles.

The first reaction temperature may be less than or equal to about 150° C.

The second reaction temperature may be less than or equal to about 280° C.

A composition according to an embodiment may include (e.g., a plurality of) the aforementioned quantum dot(s); a dispersing agent; and a (organic) solvent. The dispersing agent may include a binder polymer including a carboxylic acid group. The composition may further include a photomonomer including a carbon-carbon double bond and optionally (thermal or photo) initiators.

In an embodiment, it includes a polymer matrix and (e.g., a plurality of) the aforementioned quantum dot(s) dispersed in the polymer matrix.

The polymer matrix may be a linear polymer, a crosslinked polymer, or a combination thereof.

The polymer matrix may include a binder polymer including a carboxylic acid group,
  wherein the binder polymer including a carboxylic acid group includes
  a copolymer of a monomer combination including a first monomer including a carboxylic acid group and a carbon-carbon double bond, a second monomer including a carbon-carbon double bond and a hydrophobic moiety and not including a carboxylic acid group, and optionally a third monomer including a carbon-carbon double bond and a hydrophilic moiety and not including a carboxylic acid group;
  a multiple aromatic ring-containing polymer having a backbone structure in which two aromatic rings are bound to a quaternary carbon atom that is a constituent atom of another cyclic moiety in the main chain and including a carboxylic acid group (—COOH); or a combination thereof.

The polymer matrix may further include a polymerization product of a monomer combination including a thiol compound having at least one thiol group at the terminal end and an ene compound including a carbon-carbon unsaturated bond, a metal oxide particulate, or a combination thereof.

The quantum dot-polymer composite may have a shape of a patterned film.

The quantum dot-polymer composite may have a shape of a film having a thickness of 6 micrometers (μm) and may have an absorption rate for blue light at a wavelength of about 450 nm of greater than or equal to about 89%, when the content of the quantum dot is less than or equal to about 45% based on a total weight of the composite.

In an embodiment, a display device includes a light source and photoluminescent element, wherein the photoluminescent element includes the aforementioned quantum dot-polymer composite and the light source is configured to provide the photoluminescent element with incident light.

The incident light may have a photoluminescence peak wavelength of about 440 nm to about 460 nm.

The photoluminescent element may include a sheet of the quantum dot-polymer composite.

The photoluminescent element is a stacked structure comprising a substrate and a light emitting layer disposed on the substrate, and the light emitting layer may include a pattern of the quantum dot-polymer composite.

The pattern may include at least one repeating section configured to emit light at a predetermined wavelength.

The pattern may include a first repeating section configured to emit first light.

The pattern may further include a second repeating section configured to emit second light having a different center wavelength from the first light.

A quantum dot according to an embodiment may exhibit improved light emitting properties (e.g., improved blue light absorption rate and luminous efficiency). The quantum dot may be applied to various display devices and biological labeling (e.g., bio sensor or bio imaging, etc.), a photo detector, a solar cell, a hybrid composite, and the like. The improved blue light absorption rate that the quantum dots according to an embodiment may exhibit has potential utility in quantum dot based photoluminescent type color filters. Such photoluminescent type color filters may be used in various blue light sources, for example, blue light OLED blue light emitting micro LEDs, liquid crystal displays including blue light sources, TV, monitors, mobile devices, VR/AR, a vehicle displays, and the like.

BRIEF DESCRIPTION OF THE DRAWINGS

The above and other advantages and features of this disclosure will become more apparent by describing in further detail exemplary embodiments thereof with reference to the accompanying drawings, in which.

DETAILED DESCRIPTION

Figure 1:
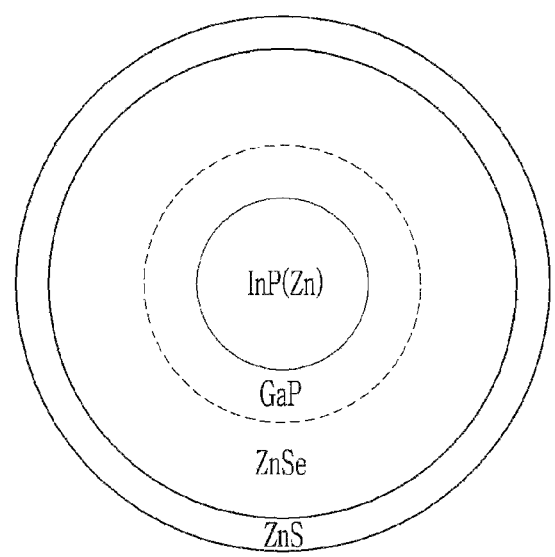
FIG. 1 is a schematic cross-sectional view of an embodiment of a quantum dot.

Advantages and characteristics of this disclosure, and a method for achieving the same, will become evident referring to the following example embodiments together with the drawings attached hereto. However, the embodiments should not be construed as being limited to the embodiments set forth herein. If not defined otherwise, all terms (including technical and scientific terms) in the specification may be defined as commonly understood by one skilled in the art. The terms defined in a generally-used dictionary may not be interpreted ideally or exaggeratedly unless clearly defined. In addition, unless explicitly described to the contrary, the word "comprise" and variations such as "comprises" or "comprising," will be understood to imply the inclusion of stated elements but not the exclusion of any other elements.

In the drawings, the thickness of layers, films, panels, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

Further, the singular includes the plural unless mentioned otherwise.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer or section from another element, component, region, layer, or section. Thus, "a first element," "component," "region," "layer," or "section" discussed below could be termed a second element, component, region, layer, or section without departing from the teachings herein.

The terminology used herein is for the purpose of describing particular embodiments only and is not intended to be limiting. As used herein, "a", "an," "the," and "at least one" do not denote a limitation of quantity, and are intended to include both the singular and plural, unless the context clearly indicates otherwise. For example, "an element" has the same meaning as "at least one element," unless the context clearly indicates otherwise. "At least one" is not to be construed as limiting "a" or "an." "Or" means "and/or." As used herein, the term "and/or" includes any and all combinations of one or more of the associated listed items.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

"About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10% or 5% of the stated value.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, when a definition is not otherwise provided, "substituted" refers to replacement of hydrogen of a compound by a substituent selected from a 01 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, halogen (—F, —Cl, —Br, or —I), a hydroxy group (—OH), a nitro group (—NO$_2$), a cyano group (—CN), an amino group (—NRR' wherein R and R' are independently hydrogen or a C1 to C6 alkyl group), an azido group (—N$_3$), an amidino group (—C(=NH)NH$_2$), a hydrazino group (—NHNH$_2$), a hydrazono group (=N(NH$_2$)), an aldehyde group (—C(=O)H), a carbamoyl group (—C(O)NH$_2$), a thiol group (—SH), an ester group (—C(=O)OR, wherein R is a 01 to C6 alkyl group or a C6 to C12 aryl group), a carboxyl group (—COOH) or a salt thereof (—C(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), and a combination thereof.

As used herein, when a definition is not otherwise provided, "monovalent" refers to a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, or a C2 to C30 heterocycloalkyl group.

As used herein, when a definition is not otherwise provided, the term "hetero" may refer to inclusion of at least one to three heteroatoms selected from, N, O, S, Si, and P.

As used herein, when a definition is not otherwise provided, "alkylene group" refers to a straight or branched saturated aliphatic hydrocarbon group having at least two valences and optionally substituted with at least one substituent.

As used herein, when a definition is not otherwise provided, "arylene group" refers to a functional group having at least two valences obtained by removal of at least two hydrogens in at least one aromatic ring, and optionally substituted with at least one substituent.

As used herein, when a definition is not otherwise provided, "aliphatic organic group" refers to a C1 to C30 linear or branched alkyl group, and "aromatic organic group" may refer to a C6 to C30 aryl group or a C2 to C30 heteroaryl group.

As used herein, when a definition is not otherwise provided, "(meth)acrylate" refers to acrylate, methacrylate, or a combination thereof.

As used herein, when a definition is not otherwise provided, "alkane" refers to a straight or branched chain saturated hydrocarbon.

As used herein, when a definition is not otherwise provided, "alkene" refers to a straight or branched chain hydrocarbon having at least one carbon-carbon double bond.

As used herein, when a definition is not otherwise provided, "alkyne" refers to a straight or branched chain hydrocarbon having at least one carbon-carbon triple bond.

As used herein, when a definition is not otherwise provided, "alkenyl" refers to a linear or branched monovalent hydrocarbon having one or more carbon-carbon double bond.

As used herein, when a definition is not otherwise provided, "alkoxy" refers to an alkyl group that is linked via an oxygen (i.e., alkyl-O—), for example methoxy, ethoxy, and sec-butyloxy groups.

As used herein, when a definition is not otherwise provided, "alkyl" refers to a straight or branched chain, saturated, monovalent hydrocarbon (e.g., methyl or hexyl).

As used herein, when a definition is not otherwise provided, "alkynyl" refers to a linear or branched monovalent hydrocarbon having one or more carbon-carbon triple bond.

As used herein, when a definition is not otherwise provided, "amino group" refers to a group of the general formula —N(R)$_2$, wherein each R is independently hydrogen, a C1 to C6 alkyl, or a C6 to C12 aryl.

As used herein, when a definition is not otherwise provided, "aryl" refers to a group formed by removal of at least one hydrogen from an aromatic hydrocarbon (e.g., a phenyl or naphthyl group).

As used herein, when a definition is not otherwise provided, "carbocyclic" refers to a cyclic group having at least one ring with only carbon atoms in the ring. One or more rings may be present, and each ring may be saturate, unsaturated, or aromatic.

As used herein, when a definition is not otherwise provided, "cycloalkenyl" refers to a monovalent hydrocarbon having one or more rings and one or more carbon-carbon double bond in the ring, wherein all ring members are carbon (e.g., cyclopentyl and cyclohexyl).

As used herein, when a definition is not otherwise provided, "cycloalkyl" refers to a monovalent hydrocarbon having one or more saturated rings in which all ring members are carbon (e.g., cyclopentyl and cyclohexyl).

As used herein, when a definition is not otherwise provided, "cycloalkynyl" refers to a stable aliphatic monocyclic or polycyclic group having at least one carbon-carbon triple bond, wherein all ring members are carbon (e.g., cyclohexynyl).

As used herein, when a definition is not otherwise provided, "heteroaryl" refers to a monovalent carbocyclic ring group that includes one or more aromatic rings, in which at least one ring member (e.g., one, two or three ring members)

is a heteroatom. In a C3 to C30 heteroaryl, the total number of ring carbon atoms ranges from 3 to 30, with remaining ring atoms being heteroatoms. Multiple rings, if present, may be pendent, spiro or fused. The heteroatom(s) are generally independently nitrogen (N), oxygen (O), P (phosphorus), or sulfur (S).

As used herein, when a definition is not otherwise provided, "hydrocarbon" refers to an organic compound having at least one carbon atom and at least one hydrogen atom, wherein one or more of the hydrogen atoms can optionally be substituted by a halogen atom (e.g., $CH_3F$, $CHF_3$ and $CF_4$ are each a hydrocarbon as used herein). As used herein, "light absorption rate" is a percentage of an amount of light absorbed in the quantum dot composite with respect to an amount of incident light (excitation light, for example blue light). A total amount of excitation light (B) is obtained by integrating a PL spectrum of excitation light, and an amount (B') of the excitation light passing through a quantum dot composite film is obtained, and the light absorption rate is obtained by the following equation:

$$(B-B')/B \times 100 = \text{light absorption (\%)}$$

As used herein, "optical density" (OD) refers to a value related to absorption rate (absorbance) as described herein and may be measured from UV-Vis spectroscopy.

As used herein, "Group" refers to a group of Periodic Table.

As used herein, "Group I" refers to Group IA and Group IB, and examples may include Li, Na, K, Rb, and Cs, but are not limited thereto.

As used herein, "Group II" refers to Group IIA and Group IIB, and examples of Group II metal may be Cd, Zn, Hg, and Mg, but are not limited thereto.

As used herein, "Group III" refers to Group IIIA and Group IIIB, and examples of Group III metal may be Al, In, Ga, and TI, but are not limited thereto.

As used herein, "Group IV" refers to Group IVA and Group IVB, and examples of a Group IV metal may be Si, Ge, and Sn, but are not limited thereto. As used herein, the term "metal" may include a semi-metal such as Si.

As used herein, "Group V" refers to Group VA, and examples may include nitrogen, phosphorus, arsenic, antimony, and bismuth, but are not limited thereto.

As used herein, "Group VI" refers to Group VIA, and examples may include sulfur, selenium, and tellurium, but are not limited thereto.

As used herein, "first absorption peak wavelength" refers to a first main peak at the lowest energy region of the UV-Vis absorption spectrum.

As used herein, values for a certain dimension (e.g., diameter, radius, thickness, size, etc.) may be values for a single entity or a plurality of average values, which may be obtained from appropriate analytical means (e.g., transmission electron microscopy (TEM) analysis or spectroscopy, etc.).

Quantum dots are nano-sized crystalline semiconductor materials (nanoparticles). Quantum dots may have a large surface area per unit volume, may exhibit a quantum confinement effect, and may exhibit different properties from properties of bulk materials of the same composition. Quantum dots may absorb light from an excitation source and may be an energy exited state and emit energy corresponding to their bandgap energies. Quantum dots have a potential to be applied, e.g., used, as light emitting materials in various devices (e.g., electronic devices).

Quantum dots having optical properties applicable to, e.g., useful in, devices may be cadmium based quantum dots. However, cadmium may raise environmental and health issues and is a regulated element. Examples of cadmium-free quantum dots may be a Group III-V based nanocrystal. However, cadmium-free quantum dots may have poor stability (e.g., chemical stability and thermal stability) compared with cadmium based quantum dots, and thus, when subjected to various processes for application to, e.g., use in, electronic devices, cadmium-free quantum dots may exhibit significantly degraded light emitting properties. Quantum dots may use blue light (e.g., wavelength of 450 nm) as excitation light, and cadmium-based or lead-based quantum dots may have high absorption intensity for blue light.

Cadmium-free quantum dots with a core-shell structure may have desirable light emitting properties and stability. For example, a cadmium-free (e.g., InP) core of a quantum dot pattern may be passivated with a ZnSe/ZnS shell having an increased thickness. However, the shell having an increased thickness may help provide desirable stability and light emitting properties, but an increased thickness of the shell thickness may increase a weight per one quantum dot and thus cause a decrease in the number of quantum dots per a given weight and accordingly, result in a problem of decreasing an excitation light absorption rate of a composite. For application to, e.g., use in, a device, the quantum dots may be dispersed in a host matrix (e.g., including a polymer, an inorganic material, or a combination thereof) and thus may form a composite. A quantum dot-polymer composite or a color filter including the same may realize, e.g., provide, a display having high luminance, a wide viewing angle, and high color reproducibility. However, a weight of the quantum dots included in the composite for the application may be limited due to several, e.g., various, reasons on a process, e.g., related to a production process thereof. Accordingly, a density decrease of the number of the quantum dots per given weight may not be preferable, for example, in terms of an excitation light absorption rate.

When applied to a patterned film, e.g., strip, such as a color filter and the like, the excitation light absorption rate decrease may directly cause a blue light leakage in a display device, have a negative influence on color reproducibility (e.g., a Digital Cinema Initiative (DCI) concordance rate), and decrease luminous efficiency. As a countermeasure to a decreased excitation light absorption rate, a dye (e.g., yellow dye)-based blue light absorption layer may be disposed between the quantum dot-based color filter and the substrate. However, this blue light absorption layer disposition may decrease blue light utilization efficiency. In addition, despite the blue light absorption layer disposition, light of less than 500 nm may be emitted in a green light pixel, and accordingly, desired color purity may not be easy to accomplish. Accordingly, development of quantum dots having desired luminous efficiency and an improved excitation light absorption rate is desired.

The present inventors have discovered that absorption of blue light having a wavelength of about 450 nm in a green light emitting quantum dot having an InP core and a ZnSe shell may be spatially affected from, e.g., by, both the core and the first shell. For example, the present inventors have discovered that absorption of blue light having a wavelength of about 450 nm may be affected from a volume of the core and the first shell having a predetermined thickness. However, the core size has a direct influence on an emission wavelength and thus may be fixed as, e.g., at, a predetermined value for emission of green light. For example, the present inventors have discovered that a ZnSe-based first shell may contribute to absorption of light having a wavelength of about 450 nm, but as the shell thickness increases, the contribution to the absorption may exponentially decrease and then, disappear at a thickness of greater than or equal to the predetermined value (e.g., about 3 ML) and an absorption rate may decrease. On the contrary, when the thickness of the ZnSe shell is small, the InP core-based quantum dots may exhibit deteriorated luminous efficiency, and accordingly, final photo-conversion efficiency of the quantum dot-polymer composite may be decreased despite the increased absorption rate.

In summary, it may be difficult for quantum dots including an InP-based core and a ZnSe-based first shell to provide desired luminous efficiency and desired absorption rate, simultaneously. Indium phosphide-based quantum dots may exhibit a low absorption rate of light having a wavelength of about 450 nm, compared with quantum dots having a different (e.g., cadmium compound or lead compound-based) composition. Improved absorption rate of light having a wavelength of about 450 nm for Indium phosphide-based quantum dots may be desired.

A quantum dot according to an embodiment has a cadmium-free structure/composition as described herein and may exhibit improved optical properties (e.g., an optical density increase at a wavelength of about 450 nm per gram (g)), and a composite including the same may emit (e.g., green) light of a desired wavelength and also exhibit an improved blue light absorption rate.

A quantum dot according to an embodiment does not include cadmium. The quantum dot includes a multi-component core including a first semiconductor nanocrystal including indium (In), zinc (Zn), and phosphorus (P), and a second semiconductor nanocrystal disposed on the first semiconductor nanocrystal and including gallium (Ga) and phosphorus (P).

A quantum dot according to an embodiment may emit green light. A maximum emission peak of the green light may be greater than or equal to about 500 nm, for example, greater than or equal to about 510 nm, greater than or equal to about 515 nm, greater than or equal to about 520 nm, greater than or equal to about 525 nm, greater than or equal to about 530 nm, greater than or equal to about 535 nm, or greater than or equal to about 540 nm and less than or equal to about 560 nm, for example, less than or equal to about 550 nm, less than or equal to about 545 nm, or less than or equal to about 540 nm.

In the quantum dot (or multi-component core), a mole ratio (P:In) of phosphorus relative to indium may be greater than or equal to about 0.6:1 and less than or equal to about 1.0:1 and a mole ratio (P:(In+Ga)) of phosphorus relative to a sum of indium and gallium may be greater than or equal to about 0.5:1 and less than or equal to about 0.8:1. In the quantum dot, a mole ratio (Ga:(In+Ga)) of gallium relative to a sum of indium and gallium may be greater than about 0:1, for example, greater than or equal to about 0.01:1, greater than or equal to about 0.02:1, greater than or equal to about 0.03:1, greater than or equal to about 0.05:1, greater than or equal to about 0.1:1, greater than or equal to about 0.15:1, greater than or equal to about 0.2:1, greater than or equal to about 0.25:1, greater than or equal to about 0.3:1, greater than or equal to about 0.35:1, greater than or equal to about 0.4:1, greater than or equal to about 0.45:1, or greater than or equal to about 0.5:1. The mole ratio (Ga:(In+Ga)) of gallium relative to a sum of indium and gallium may be less than about 1:1, less than or equal to about 0.9:1, less than or equal to about 0.8:1, less than or equal to about 0.7:1, less than or equal to about 0.6:1, less than or equal to about 0.5:1, less than or equal to about 0.4:1, less than or equal to about 0.3:1, less than or equal to about 0.2:1, or less than or equal to about 0.1:1.

In an embodiment, a size of the multi-component core may be greater than or equal to about 2.3 nm, greater than or equal to about 2.4 nm, greater than or equal to about 2.5 nm, or greater than or equal to about 2.52 nm. The size of the core may be less than or equal to about 5 nm, less than or equal to about 4.9 nm, less than or equal to about 4.8 nm, less than or equal to about 4.7 nm, less than or equal to about 4.6 nm, less than or equal to about 4.5 nm, less than or equal to about 4.4 nm, less than or equal to about 4.3 nm, or less than or equal to about 4.2 nm. As used herein, the "size" may refer to a size of a single quantum dot or an average size of a plurality of quantum dots.

In the quantum dot, a mole ratio (P:In) of phosphorus relative to indium may be greater than or equal to about 0.6:1, for example, greater than or equal to about 0.66:1, greater than or equal to about 0.67:1, greater than or equal to about 0.68:1, greater than or equal to about 0.69:1, greater than or equal to about 0.70:1, greater than or equal to about 0.71:1, greater than or equal to about 0.72:1, greater than or equal to about 0.73:1, greater than or equal to about 0.74:1, or greater than or equal to about 0.75:1. The mole ratio (P:In) of phosphorus relative to indium may be less than or equal to about 1:1, less than about 1:1, less than or equal to about 0.95:1, less than 0.95:1, less than or equal to about 0.9:1, less than about 0.9:1, less than or equal to about 0.89:1, less than or equal to about 0.88:1, less than or equal to about 0.87:1, less than or equal to about 0.86:1, less than or equal to about 0.85:1, less than or equal to about 0.84:1, less than or equal to about 0.83:1 less than or equal to about 0.82:1, or less than or equal to about 0.81:1.

In the quantum dot, a mole ratio (P:(In+Ga)) of phosphorus relative to a sum of indium and gallium may be greater than or equal to about 0.5:1, for example, greater than or equal to about 0.51:1, greater than or equal to about 0.52:1, greater than or equal to about 0.53:1, greater than or equal to about 0.54:1, greater than or equal to about 0.55:1, greater than or equal to about 0.56:1, greater than or equal to about 0.57:1, greater than or equal to about 0.58:1, greater than or equal to about 0.59:1, greater than or equal to about 0.60:1, greater than or equal to about 0.61:1, greater than or equal to about 0.62:1, greater than or equal to about 0.63:1, greater than or equal to about 0.64:1, greater than or equal to about 0.65:1, greater than or equal to about 0.66:1, greater than or equal to about 0.67:1, or greater than or equal to about 0.68:1. In the quantum dot, the mole ratio (P:(In+Ga)) of phosphorus relative to a sum of indium and gallium may be less than or equal to about 0.8:1, for example, less than or equal to about 0.79:1, less than or equal to about 0.78:1, less than or equal to about 0.77:1, less than or equal to about 0.76:1, less than or equal to about 0.75:1, less than or equal to about 0.74:1, less than or equal to about 0.73:1, or less than or equal to about 0.72:1.

In the quantum dot, when a first absorption peak in the UV-Vis absorption spectrum is less than or equal to about 440 nm, a mole ratio (P:(Zn+In+Ga)) of phosphorus relative to a sum of indium, zinc, and gallium may be greater than or equal to about 0.2:1, for example, greater than or equal to about 0.25:1, greater than or equal to about 0.3:1, greater than or equal to about 0.35:1, greater than or equal to about 0.4:1, greater than or equal to about 0.45:1, or greater than or equal to about 0.5:1. In the quantum dot, when the first absorption peak in the UV-Vis absorption spectrum is less than or equal to about 440 nm, the mole ratio (P:(Zn+In+Ga)) of phosphorus relative to a sum of indium, zinc, and gallium may be less than about 0.77:1, less than or equal to about 0.76:1, less than or equal to about 0.75:1, less than or equal to about 0.74:1, less than or equal to about 0.73:1, less than or equal to about 0.71:1, less than or equal to about 0.70:1, less than or equal to about 0.69:1, less than or equal to about 0.68:1, less than or equal to about 0.67:1, less than or equal to about 0.66:1, less than or equal to about 0.65:1, less than or equal to about 0.64:1, less than or equal to about 0.63:1, less than or equal to about 0.62:1, less than or equal to about 0.61:1, less than or equal to about 0.6:1, or less than or equal to about 0.59:1.

When the first absorption peak in the UV-Vis absorption spectrum of the quantum dot is less than or equal to about 440 nm, the quantum dot may have a mole ratio ((Zn+Ga):In) of a sum of zinc and gallium relative to indium of less than about 0.75:1, for example, less than or equal to about 0.74:1, less than or equal to about 0.73:1, less than or equal to about 0.72:1, less than or equal to about 0.71:1, less than or equal to about 0.70:1, less than or equal to about 0.69:1, less than or equal to about 0.68:1, less than or equal to about 0.67:1, less than or equal to about 0.66:1, less than or equal to about 0.65:1, less than or equal to about 0.64:1, less than or equal to about 0.63:1, less than or equal to about 0.62:1, less than or equal to about 0.61:1, less than or equal to about 0.60:1, less than or equal to about 0.59:1, less than or equal to about 0.58:1, less than or equal to about 0.57:1, less than or equal to about 0.56:1, less than or equal to about 0.55:1, less than or equal to about 0.54:1, less than or equal to about 0.53:1, less than or equal to about 0.52:1, less than or equal to about 0.51:1, or less than or equal to about 0.5:1. When the first absorption peak in the UV-Vis absorption spectrum of the quantum dot is less than or equal to about 440 nm, the quantum dot may have a mole ratio ((Zn+Ga):In) of a sum of zinc and gallium relative to indium of greater than or equal to about 0.30:1, greater than or equal to about 0.34:1, greater than or equal to about 0.37:1, or greater than or equal to about 0.4:1.

Without being bound by any particular theory, it is understood that a structure of a quantum dot according to an embodiment may be prepared in a method as described below and may be represented by a combination of the aforementioned composition ratios. Accordingly, a quantum dot according to an embodiment may exhibit an improved absorption rate (e.g., an optical density in blue light as described herein) along with a minimized, e.g., minimal, weight increase, and a quantum dot-polymer composite (or a pattern thereof) including the same may exhibit a desired blue light absorption rate.

Conventionally, a shell including gallium and phosphorus has been formed on a core including indium (and optionally, zinc) and phosphorus. In the conventional method, indium (zinc) phosphide semiconductor nanocrystal particles may be formed first by reacting an indium precursor and a phosphorus precursor, optionally in the presence of a zinc precursor, and then, the gallium precursor and the phosphorus precursor are injected thereinto, e.g., added thereto, to form a GaP layer. However, the present inventors have discovered that a ratio of phosphorous relative to indium and a ratio of phosphorous relative to a sum of indium and gallium cannot be adjusted as defined above, and as a result, the manufactured particles cannot exhibit blue light absorption rate at a desired level while emitting light of a desired wavelength (e.g., a green wavelength).

The multi-component core according to an embodiment may be manufactured by the method disclosed below and have a different structure from that of the quantum dots obtained according to the conventional method. Accordingly, the quantum dot according to an embodiment may have the composition defined above, and thus, may exhibit improved optical properties. Without being bound by any particular theory, it is understood that with the structure of a quantum dot according to an embodiment and a composition reflecting the same, a volume of the core involved in light emission in a quantum dot having a limited shell thickness may increase, which may allow a mole absorption coefficient of the (individual) quantum dot to increase. The number density, e.g., number, of quantum dots included in a given weight may be decreased, but it has been confirmed that a group of the quantum dots according to an embodiment may exhibit improved optical density of light at a wavelength of 450 nm despite this volume increase, and when prepared into a quantum dot-polymer composite, an improved blue light absorption rate may be obtained.

Accordingly, the quantum dot of an embodiment may have a first absorption peak of less than or equal to about 440 nm in the UV-Vis absorption spectrum.

In an embodiment, the quantum dot may have optical density at a wavelength of about 450 nm per gram (g) of greater than or equal to about 1,100, for example, greater than or equal to about 1,200, greater than or equal to about 1,300, greater than or equal to about 1,400, greater than or equal to about 1,450, greater than or equal to about 1,500, greater than or equal to about 1,550, greater than or equal to about 1,600, greater than or equal to about 1,650, greater than or equal to about 1,700, greater than or equal to about 1,750, greater than or equal to about 1,800, or greater than or equal to about 1,850.

In an embodiment, the (core or core-shell) quantum dot may have a ratio of intensity at a wavelength of about 450 nm relative to an intensity at a wavelength of about 350 nm in the UV-Vis absorption spectrum of greater than or equal to about 0.4:1, greater than or equal to about 0.43:1, greater than or equal to about 0.44:1, greater than or equal to about 0.45:1, greater than or equal to about 0.46:1, greater than or equal to about 0.47:1, greater than or equal to about 0.48:1, greater than or equal to about 0.49:1, greater than or equal to about 0.5:1, greater than or equal to about 0.51:1, greater than or equal to about 0.55:1, greater than or equal to about 0.6:1, greater than or equal to about 0.65:1, greater than or equal to about 0.66:1, greater than or equal to about 0.67:1, greater than or equal to about 0.7:1, greater than or equal to about 0.75:1, greater than or equal to about 0.8:1, greater than or equal to about 0.82:1, greater than or equal to about 0.84:1, greater than or equal to about 0.86:1, greater than or equal to about 0.87:1, or greater than or equal to about 0.88:1. The quantum dot may have a ratio of intensity at a wavelength of about 450 nm relative to an intensity at a wavelength of about 350 nm in the UV-Vis absorption spectrum of greater than or equal to about 1.0:1.

The quantum dot of an embodiment has a core-multi-layered shell structure having a first shell including ZnSe disposed (e.g., directly) on the core having the aforementioned composition and a second shell including ZnS disposed (e.g., directly) on the first shell.

The first semiconductor nanocrystal shell may include ZnSe. The first semiconductor nanocrystal shell may not include sulfur (S). For example, the first semiconductor nanocrystal shell may not include ZnSeS. The first semiconductor nanocrystal shell may be composed of ZnSe. The first semiconductor nanocrystal shell may be disposed directly on the semiconductor nanocrystal core.

In an embodiment, the first semiconductor nanocrystal shell has a thickness of about 3 monolayers (ML) or more, for example, about 3.5 ML or more, about 3.6 ML or more, about 3.7 ML or more, about 3.8 ML or more, about 3.9 ML or more, or about 4 ML or more. The thickness of the first semiconductor nanocrystal shell may be about 7 ML or less, for example, about 6 ML or less, or about 5 ML or less. In an embodiment, the thickness of the first semiconductor nanocrystal shell may be greater than or equal to about 0.9 nm, greater than or equal to about 1 nm, greater than or equal to about 1.1, or greater than or equal to about 1.2 nm and less than or equal to about 1.4 nm, less than or equal to about 1.3 nm, or less than or equal to about 1.25 nm.

The second semiconductor nanocrystal shell may include ZnS. The second semiconductor nanocrystal shell may not include selenium. The second semiconductor nanocrystal shell may be disposed directly on the first semiconductor nanocrystal shell. The second semiconductor nanocrystal shell may be an outermost layer of the quantum dot. The thickness of the second semiconductor nanocrystal shell may be greater than or equal to about 0.15 nm, greater than or equal to about 0.16 nm, greater than or equal to about 0.17 nm, greater than or equal to about 0.18 nm, greater than or equal to about 0.19 nm, or greater than or equal to about 0.2 nm and 0.7 nm, less than or equal to about 0.65 nm, less than or equal to about 0.5 nm, less than or equal to about 0.45 nm, or less than or equal to about 0.4 nm.

The quantum dot having the aforementioned structure according to an embodiment may have a mole ratio (S:Se) of sulfur relative to selenium of less than or equal to about 2.5:1, and thus may exhibit improved light emitting properties with increased light absorption rate. In a quantum dot according to an embodiment, the mole ratio of sulfur relative to selenium may be less than or equal to about 2.4:1, less than or equal to about 2.3:1, less than or equal to about 2.2:1, less than or equal to about 2.1:1, less than or equal to about 2.0:1, less than or equal to about 1.9:1, less than or equal to about 1.8:1, less than or equal to about 1.7:1, less than or equal to about 1.6:1, less than or equal to about 1.5:1, less than or equal to about 1.4:1, less than or equal to about 1.3:1, less than or equal to about 1.2:1, less than or equal to about 1.1:1, or less than or equal to about 1:1, less than or equal to about 0.9:1, less than or equal to about 0.8:1, or less than or equal to about 0.6:1. In a quantum dot according to an embodiment, the mole ratio of sulfur relative to selenium may be greater than or equal to about 0.1:1, greater than or equal to about 0.2:1, greater than or equal to about 0.3:1, greater than or equal to about 0.4:1, or greater than or equal to about 0.5:1.

The quantum dot may have a mole ratio of zinc relative to a sum of indium and gallium (Zn:(In+Ga)) of less than or equal to about 45:1, for example, less than or equal to about 30:1, less than or equal to about 29:1, less than or equal to about 28:1, less than or equal to about 27:1, less than or equal to about 26:1, less than or equal to about 25:1, or less than or equal to about 24:1. The quantum dot may have a mole ratio of zinc relative to a sum of indium and gallium of greater than or equal to about 10:1, greater than or equal to about 11:1, greater than or equal to about 12:1, greater than or equal to about 13:1, greater than or equal to about 14:1, or greater than or equal to about 15:1.

The quantum dot may have a mole ratio of a sum of indium and gallium relative to a sum of selenium and sulfur ((Ga+In):(S+Se)) of greater than or equal to about 0.01:1, greater than or equal to about 0.02:1, greater than or equal to about 0.03:1, greater than or equal to about 0.04:1, greater than or equal to about 0.05:1, greater than or equal to about 0.07:1, greater than or equal to about 0.09:1, or greater than or equal to about 0.1:1. The quantum dot may have a mole ratio of a sum of indium and gallium relative to a sum of selenium and sulfur of less than or equal to about 0.2:1, less than or equal to about 0.15:1, less than or equal to about 0.1:1, less than or equal to about 0.09:1, less than or equal to about 0.08:1, or less than or equal to about 0.07:1.

The present inventors have discovered that a quantum dot according to an embodiment has the aforementioned core and shell composition and thus may provide a quantum dot-polymer composite having an improved excitation light absorption rate and improved luminous efficiency. For example, in a quantum dot according to an embodiment, the thickness of the (e.g., ZnSe-based) first semiconductor nanocrystal shell may have a positive influence on increasing quantum dot luminous efficiency within the aforementioned range. Meanwhile, the thickness of the (e.g., ZnS-based) second semiconductor nanocrystal shell may not have a negative influence on luminous efficiency of the quantum dot within the aforementioned range, an excitation light (e.g., blue light) absorption rate of the film may be improved. In addition, a quantum dot according to an embodiment may has a shell having the aforementioned composition and exhibit high chemical stability, and a composition or a composite (or pattern thereof) including the same may exhibit improved light emitting properties after a composition (e.g., photosensitive composition or photoresist)-forming process accompanied with a contact with various chemical materials (e.g., an organic polymer, an organic solvent, a monomer, various additives, and the like) or a composite (or a pattern thereof)-forming process using the composition.

Accordingly, a quantum dot according to an embodiment may have a quantum efficiency of greater than or equal to about 65%, for example, greater than or equal to about 66%, greater than or equal to about 67%, greater than or equal to about 68%, greater than or equal to about 69%, or greater than or equal to about 70%.

A light absorption rate at wavelength of about 350 nm may represent absorption (e.g., depending on a size) of the first semiconductor nanocrystal shell (e.g., ZnSe) and the second semiconductor nanocrystal shell (e.g., ZnS) and absorption intensity at a wavelength of about 450 nm may for example represent a wavelength of the blue light source that may be provided for a device including a quantum dot (QD) based color filter. In the UV-Vis absorption spectrum of the quantum dot, a ratio of the absorption intensity of the quantum dot at a wavelength of about 450 nm:the absorption intensity at a wavelength of about 350 nm indicates an absorption ability of the blue light source of the quantum dot according to a volume of the shell of a quantum dot according to an embodiment. When the aforementioned shell composition is satisfied, the monolayer including the same may exhibit a high level of blue light absorption rate as the ratio of the absorption intensity at a wavelength of about 450 nm:absorption intensity at a wavelength of about 350 nm of the quantum dot increases. The quantum dot of an embodiment may have a ratio of the intensity at the wavelength of about 450 nm relative to the intensity at the wavelength of about 350 nm in the UV-Vis absorption spectrum of greater than or equal to about 0.08:1. Accordingly, the quantum dot of an embodiment may have a ratio of intensity at a wavelength of about 450 nm relative to an intensity at a wavelength of about 350 nm of greater than or equal to about 0.08:1, for example, 0.09:1, greater than or equal to about 0.10:1, or greater than or equal to about 0.11:1 in the UV-Vis absorption spectrum.

In an embodiment, the quantum dot-polymer composite may have a shape of a film having a thickness of 6 μm, and may have an absorption rate for blue light at a wavelength of about 450 nm of greater than or equal to about 89%, greater than or equal to about for example, 90%, greater than or equal to about 91%, greater than or equal to about 92%, or greater than or equal to about 93% when the content of the quantum dot is less than or equal to about 45% based on a total weight of the composite.

In the UV-Vis absorption spectrum of the quantum dot, the first absorption peak wavelength may be present in a range of greater than about 450 nm and less than the photoluminescence peak wavelength. For example, in the case of the green light emitting quantum dot, the first absorption peak wavelength may be for example greater than or equal to about 480 nm, greater than or equal to about 485 nm, or greater than or equal to about 490 nm and less than or equal to about 530 nm, less than or equal to about 525 nm, less than or equal to about 520 nm, less than or equal to about 515 nm, or less than or equal to about 510 nm.

A size (average size) of the quantum dot may be greater than or equal to about 5 nm, greater than or equal to about 5.5 nm, greater than or equal to about 6 nm, greater than or equal to about 6.5 nm, or greater than or equal to about 7 nm. The size (average size) of the quantum dot may be less than or equal to about 10 nm, less than or equal to about 9 nm, less than or equal to about 8 nm, or less than or equal to about 7 nm. The size of the quantum dot may be a particle diameter. The size of the quantum dot may be a diameter calculated by converting a two-dimensional area identified by transmission electron microscopic analysis into a circle (when it is not a spherical shape).

The quantum dot is not limited to particular shapes, and may have, for example, a spherical shape, a polyhedron, a pyramid, a multipod, or a cube, a nanotube, a nanowire, a nanofiber, a nanosheet, or a combination thereof, but is not limited thereto.

The quantum dot may include an organic ligand on a surface thereof, an organic solvent, or a combination thereof as described herein. The organic ligand, the organic solvent, or the combination thereof may be bound to the surface of the quantum dot.

In an embodiment, a method of producing a quantum dot according to an embodiment includes forming the multi-component core and optionally forming a shell on the multi-component core. Details on the composition of the multi-component core may be the same as described herein.

The forming of the multi-component core includes reacting an indium precursor with a phosphorus precursor at a first reaction temperature in an organic solvent in the presence of an organic ligand to form particles including a first semiconductor nanocrystal; injecting an zinc precursor at a temperature equal to or less than the first reaction temperature to form a zinc-containing coating on the surfaces of the particles including the first semiconductor nanocrystal; and injecting a gallium precursor and a phosphorus precursor while heating the temperature of the reaction system including the particles on which the zinc-containing coating is formed up to a second reaction temperature to form a second semiconductor nanocrystal on the first semiconductor nanocrystal, wherein the second reaction temperature is higher than the first reaction temperature.

The forming of the multi-component core may be performed by one-pot synthesis without separation of the produced particles. In an embodiment, the particles including the first semiconductor nanocrystal may be greater than or equal to about 0.9 nm, for example, 1 nm, greater than or equal to about 1.1 nm, greater than or equal to about 1.2 nm, greater than or equal to about 1.3 nm, greater than or equal to about 1.4 nm, greater than or equal to about 1.5 nm, greater than or equal to about 1.6 nm, greater than or equal to about 1.7 nm, greater than or equal to about 1.8 nm, or greater than or equal to about 1.9 nm. In an embodiment, the particles including the first semiconductor nanocrystal may be less than or equal to about 2.1 nm, less than or equal to about 2 nm, less than or equal to about 1.9 nm, less than or equal to about 1.8 nm, less than or equal to about 1.7 nm, less than or equal to about 1.6 nm, less than or equal to about 1.5 nm, less than or equal to about 1.4 nm, less than or equal to about 1.3 nm, or less than or equal to about 1.2 nm.

The first reaction temperature may be less than or equal to about 150° C., for example, less than or equal to about 140° C., less than or equal to about 130° C., less than or equal to about 120° C., less than or equal to about 110° C., less than or equal to about 100° C., or less than or equal to about 90° C. The first reaction temperature may be greater than or equal to about 30° C., greater than or equal to about 40° C., greater than or equal to about 60° C., greater than or equal to about 80° C., or greater than or equal to about 90° C. The second reaction temperature may be greater than or equal to about 130° C., greater than or equal to about 140° C., greater than or equal to about 150° C., greater than or equal to about 160° C., or greater than or equal to about 170° C.

The second reaction temperature may be less than or equal to about 280° C., less than or equal to about 270° C., less than or equal to about 260° C., less than or equal to about 255° C., less than or equal to about 250° C., less than or equal to about 245° C., less than or equal to about 240° C., less than or equal to about 235° C., less than or equal to about 230° C., less than or equal to about 225° C., less than or equal to about 220° C., less than or equal to about 215° C., less than or equal to about 210° C., less than or equal to about 205° C., or less than or equal to about 200° C. The first reaction temperature and the second reaction temperature may be controlled by types and concentrations of precursors (e.g., reactivity) present in the reaction system.

The second reaction temperature may be higher than the first reaction temperature, by greater than or equal to about 10° C., for example, greater than or equal to about 20° C., greater than or equal to about 30° C., greater than or equal to about 40° C., greater than or equal to about 50° C., greater than or equal to about 60° C., greater than or equal to about 70° C., greater than or equal to about 80° C., greater than or equal to about 90° C., greater than or equal to about 100° C., greater than or equal to about 110° C., greater than or equal to about 120° C., greater than or equal to about 130° C., greater than or equal to about 140° C., or greater than or equal to about 150° C.

The shell may be formed by a method by obtaining a first mixture including a zinc precursor, an organic ligand, and an organic solvent;

obtaining a second mixture by injecting the aforementioned multi-component core and a selenium-containing precursor into the first mixture;

heating the second mixture up to a shell-forming temperature for greater than or equal to about 40 minutes, for example, for greater than or equal to about 50 minutes to obtain a third mixture including particles on which a first semiconductor nanocrystal shell including zinc and selenium is formed on the semiconductor nanocrystal core; and adding a sulfur-containing precursor (e.g., a stock solutions including the sulfur-containing precursor) to the third mixture at the shell-forming temperature and performing a reaction to form a second semiconductor nanocrystal shell including zinc and sulfur on the first semiconductor nanocrystal shell, wherein in the second mixture and the third mixture, the contents of the selenium-containing precursor and the sulfur-containing precursor relative to the core (and, optionally, the reaction time at each step) are adjusted to satisfy the aforementioned shell composition.

The first mixture may optionally be heated (pre-treated) at a predetermined temperature, for example greater than or equal to about 100° C., greater than or equal to about 120° C., greater than or equal to about 150° C., greater than or equal to about 200° C., greater than or equal to about 250° C., or greater than or equal to about 270° C., for example, under vacuum, an inert atmosphere, or a combination thereof.

The organic ligand may include RCOOH, $RNH_2$, $R_2NH$, $R_3N$, RSH, $RH_2PO$, $R_2HPO$, $R_3PO$, $RH_2P$, $R_2HP$, $R_3P$, ROH, RCOOR', $RPO(OH)_2$, RHPOOH, $R_2POOH$ (wherein, R and R' are independently a C1 to C24 aliphatic hydrocarbon (e.g., a C1 to C40 or a C3 to C24 alkyl group, a C2 to C40 or a C3 to C24 alkenyl group, a C2 to C40 or a C3 to C24 alkynyl group), or a C6 to C20 aromatic hydrocarbon (e.g., a C6 to C20 aryl group)), or a combination thereof. The organic ligand may coordinate, e.g., to or be bound to, the surface of the obtained nanocrystal and may help the nanocrystal to be well dispersed in the solution, affect light emitting and electrical characteristics of quantum dots, or a combination thereof. Examples of the organic ligand may include methane thiol, ethane thiol, propane thiol, butane thiol, pentane thiol, hexane thiol, octane thiol, dodecane thiol, hexadecane thiol, octadecane thiol, benzyl thiol; methyl amine, ethyl amine, propyl amine, butyl amine, pentyl amine, hexyl amine, octyl amine, dodecyl amine, hexadecyl amine, octadecyl amine, dimethyl amine, diethyl amine, dipropyl amine; methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, or benzoic acid; a phosphine such as a substituted or unsubstituted methyl phosphine (e.g., trimethyl phosphine, methyldiphenyl phosphine, etc.), a substituted or unsubstituted ethyl phosphine (e.g., triethyl phosphine, ethyldiphenyl phosphine, etc.), a substituted or unsubstituted propyl phosphine, a substituted or unsubstituted butyl phosphine, a substituted or unsubstituted pentyl phosphine, or a substituted or unsubstituted octylphosphine (e.g., trioctylphosphine (TOP)); a phosphine oxide such as a substituted or unsubstituted methyl phosphine oxide (e.g., trimethyl phosphine oxide, methyldiphenyl phosphine oxide, etc.), a substituted or unsubstituted ethyl phosphine oxide (e.g., triethyl phosphine oxide, ethyldiphenyl phosphine oxide, etc.), a substituted or unsubstituted propyl phosphine oxide, a substituted or unsubstituted butyl phosphine oxide, or a substituted or unsubstituted octyl phosphine oxide (e.g., trioctylphosphine oxide (TOPO)); diphenyl phosphine, a triphenyl phosphine compound, or an oxide compound thereof; a C5 to C20 alkylphosphinic acid or a C5 to C20 alkyl phosphonic acid such as phosphonic acid, hexylphosphinic acid, octylphosphinic acid, dodecanephosphinic acid, tetradecanephosphinic acid, hexadecanephosphinic acid, or octadecanephosphinic acid; and the like, but are not limited thereto. The organic ligand may be used alone or as a mixture of two or more.

The organic solvent may be selected from a C6 to C22 primary amine such as hexadecylamine; a C6 to C22 secondary amine such as dioctylamine; a C6 to C40 tertiary amine such as trioctylamine; a nitrogen-containing heterocyclic compound such as pyridine; a C6 to C40 aliphatic hydrocarbon (e.g., alkane, alkene, alkyne, etc.) such as hexadecane, octadecane, octadecene, or squalane; a C6 to C30 aromatic hydrocarbon such as phenyldodecane, phenyltetradecane, or phenyl hexadecane; phosphine substituted with a C6 to C22 alkyl group such as trioctylphosphine; phosphine oxide substituted with a C6 to C22 alkyl group such as trioctylphosphine oxide; a C12 to C22 aromatic ether such as phenyl ether, or benzyl ether, and a combination thereof. The type and the content of the solvent may be appropriately selected taking into consideration types and amounts of the used precursors and organic ligands.

The types of the indium precursor may be indium halide, indium nitrate, indium hydroxide, indium fluoride, indium chloride, indium bromide, indium iodide, indium oxide, indium sulfate, indium carboxylate, indium acetate, indium acetylacetonate, or a combination thereof.

The types of the gallium precursor may be gallium chloride, gallium acetylacetonate, gallium fluoride, gallium oxide, gallium nitrate, gallium sulfate, gallium bromide, gallium iodide, or a combination thereof.

The zinc precursor may be a Zn metal powder, an alkylated Zn compound, a Zn alkoxide, a Zn carboxylate, Zn nitrate, Zn chlorate, Zn sulfate, Zn acetylacetonate, a Zn halide, Zn cyanide, Zn hydroxide, Zn oxide, Zn peroxide, or a combination thereof. Examples of the first shell precursor may be dimethyl zinc, diethyl zinc, zinc acetate, zinc acetylacetonate, zinc iodide, zinc bromide, zinc chloride, zinc fluoride, zinc carbonate, zinc cyanide, zinc nitrate, zinc oxide, zinc peroxide, zinc perchlorate, zinc sulfate, and the like. The first shell precursor may be used alone or in combination of two or more thereof.

The types of the selenium precursor are not particularly limited and may be appropriately selected. For example, the selenium precursor may be selenium-trioctylphosphine (Se-TOP), selenium-tributylphosphine (Se-TBP), selenium-triphenylphosphine (Se-TPP), tellurium tributylphosphine (Te-TBP), or a combination thereof, but is not limited thereto.

The types of the sulfur precursor are not particularly limited and may be appropriately selected. The sulfur precursor may include hexane thiol, octane thiol, decane thiol, dodecane thiol, hexadecane thiol, mercapto propyl silane, sulfur-trioctylphosphine (S-TOP), sulfur-tributylphosphine (S-TBP), sulfur-triphenylphosphine (S-TPP), sulfur-trioctylamine (S-TOA), trimethylsilyl sulfur, ammonium sulfide, sodium sulfide, or a combination thereof. The sulfur precursor may be injected one or more times (e.g., two or more times).

The shell-forming temperature may be selected appropriately. For example, the shell-forming temperature may be greater than or equal to about 280° C., greater than or equal to about 290° C., greater than or equal to about 300° C., greater than or equal to about 310° C., or greater than or equal to about 315° C. After heating the second mixture up to the shell-forming temperature or during the heating process, the selenium precursor may be added one or more times (e.g., twice, three times or more). The second mixture is maintained at the shell-forming temperature for a predetermined time (for example, greater than or equal to about 40 minutes, for example, 50 minutes, greater than or equal to about 60 minutes, greater than or equal to about 70 minutes, greater than or equal to about 80 minutes, or greater than or equal to about 90 minutes and less than or equal to about 4 hours, for example, less than or equal to about 3 hours, or less than or equal to about 2 hours) to obtain a third mixture including particles including the first semiconductor nanocrystal shell including zinc and selenium which is formed on the semiconductor nanocrystal core.

The second mixture may be maintained at the shell-forming temperature for the aforementioned range of time to form the first semiconductor nanocrystal shell with the desired thickness (e.g., 3 monolayers or more). In this case, in the second mixture, the content of the selenium precursor relative to indium may be adjusted to form a first semiconductor nanocrystal shell having a predetermined thickness for the predetermined reaction time. For example, in the second mixture, the content of the selenium per 1 mole of indium may be greater than or equal to about 3 moles, greater than or equal to about 4 moles, greater than or equal to about 5 moles, greater than or equal to about 6 moles, greater than or equal to about 7 moles, greater than or equal to about 8 moles, greater than or equal to about 9 moles, or greater than or equal to about 10 moles. In the second mixture, the content of the selenium per 1 mole of indium may be less than or equal to about 20 moles, less than or equal to about 18 moles, or less than or equal to about 15 moles.

The third mixture may not include the selenium precursor. At the shell-forming temperature, the second semiconductor nanocrystal shell including zinc and sulfur is formed on the first semiconductor nanocrystal shell by adding a stock solution including the sulfur precursor to the third mixture. The method does not include decreasing the temperature of the third mixture below 50° C. (e.g., below 30° C. or room temperature).

In an embodiment, the content of the sulfur per 1 mole of a sum of the indium and gallium in the third mixture is adjusted so that the desired shell composition may be obtained (e.g., not exceeding 0.7 nm in a thickness) (taking into consideration the reactivity and reaction temperature of the precursor). For example, in the third mixture, the content of the sulfur per 1 mole of the sum of the indium and gallium may be greater than or equal to about 2 moles, greater than or equal to about 3 moles, greater than or equal to about 4 moles, greater than or equal to about 5 moles, greater than or equal to about 6 moles, greater than or equal to about 7 moles, greater than or equal to about 8 moles, greater than or equal to about 9 moles, or greater than or equal to about 10 moles. For example, in the third mixture, the content of the sulfur per 1 mole of indium may be less than or equal to about 45 moles, less than or equal to about 40 moles, less than or equal to about 35 moles, less than or equal to about 30 moles, less than or equal to about 25 moles, less than or equal to about 20 moles, less than or equal to about 19 moles, less than or equal to about 18 moles, less than or equal to about 16 moles, less than or equal to about 15 moles, less than or equal to about 14 moles, less than or equal to about 13 moles, less than or equal to about 12 moles, less than or equal to about 11 moles, less than or equal to about 10 moles, less than or equal to about 9 moles, less than or equal to about 8 moles, less than or equal to about 7 moles, less than or equal to about 6 moles, or less than or equal to about 5 moles.

The shell-forming temperature may be the same or different in each step. In an embodiment, the ZnSe-based shell-forming temperature may be greater than or equal to about 280° C., for example, greater than or equal to about 285° C., greater than or equal to about 290° C., greater than or equal to about 295° C., greater than or equal to about 300° C., or greater than or equal to about 305° C. and less than or equal to about 320° C., for example, less than or equal to about 315° C., or less than or equal to about 310° C., and an outermost shell (ZnS shell)-forming temperature may be greater than or equal to about 280° C., greater than or equal to about 285° C., greater than or equal to about 290° C., or greater than or equal to about 295° C. and less than or equal to about 300° C., for example, less than or equal to about 295° C., or less than or equal to about 290° C.

The addition of a nonsolvent to the prepared final reaction solution may allow nanocrystals coordinated with the organic ligands to be separated (e.g., precipitated). The nonsolvent may be a polar solvent that is miscible with the solvent used in the reaction and nanocrystals are not dispersible therein. The nonsolvent may be selected depending on the solvent used in the reaction and may be for example, acetone, ethanol, butanol, isopropanol, ethanediol, water, tetrahydrofuran (THF), dimethylsulfoxide (DMSO), diethylether, formaldehyde, acetaldehyde, a solvent having a similar solubility parameter to the foregoing solvents, or a combination thereof. The separation may be performed through a centrifugation, precipitation, chromatography, or distillation. The separated nanocrystals may be added to the washing solvent and then washed as desired. The washing solvent is not particularly limited, and a solvent having a solubility parameter similar to that of the ligand may be used. Examples thereof may include hexane, heptane, octane, chloroform, toluene, and benzene.

An embodiment provides a composition including the aforementioned quantum dots. The composition may include (e.g., a plurality of) the aforementioned quantum dot(s); a dispersing agent (e.g., a binder polymer including a carboxylic acid group); and a (organic) solvent. The composition may further include a photopolymerizable monomer including a carbon-carbon double bond and optionally (thermal or photo) initiator.

The content of the aforementioned quantum dot in the composition may be appropriately adjusted taking into consideration a desirable final use (e.g., color filter, etc.). In an embodiment, the content of the quantum dot may be greater than or equal to about 1 weight percent (wt %), for example, greater than or equal to about 2 wt %, greater than or equal to about 3 wt %, greater than or equal to about 4 wt %, greater than or equal to about 5 wt %, greater than or equal to about 6 wt %, greater than or equal to about 7 wt %, greater than or equal to about 8 wt %, greater than or equal to about 9 wt %, greater than or equal to about 10 wt %, greater than or equal to about 15 wt %, greater than or equal to about 20 wt %, greater than or equal to about 25 wt %, greater than or equal to about 30 wt %, greater than or equal to about 35 wt %, or greater than or equal to about 40 wt % based on a solid content of the composition. The content of the quantum dot may be less than or equal to about 70 wt %, for example, less than or equal to about 65 wt %, less than or equal to about 60 wt %, less than or equal to about 55 wt %, or less than or equal to about 50 wt % based on a solid content of the composition.

In the present specification, the solid content of the composition may represent the contents of the corresponding components in the composite as described herein.

The composition according to an embodiment may be used to produce a quantum dot-polymer composite or a pattern thereof. The composition according to an embodiment may be a quantum dot-containing photoresist composition to which a photolithography method may be applied. The composition according to an embodiment may be an ink composition that may provide a pattern by printing (e.g., a droplet discharge method such as inkjet printing). The composition according to an embodiment may not include a conjugated polymer (except a cardo binder as described herein). The composition according to an embodiment may include a conjugated polymer. Herein, the conjugated polymer refers to a polymer having a conjugation double bond in its main chain (e.g., polyphenylenevinylene, etc.). The composition according to an embodiment may include a dispersing agent or a binder polymer. The binder polymer may include a carboxylic acid group.

The binder polymer may include a copolymer of a monomer mixture including a first monomer including a carboxylic acid group and a carbon-carbon double bond, a second monomer including a carbon-carbon double bond and a hydrophobic moiety and not including a carboxylic acid group, and optionally a third monomer including a carbon-carbon double bond and a hydrophilic moiety and not including a carboxylic acid group; a multiple aromatic ring-containing polymer having a backbone structure in which two aromatic rings are bound to a quaternary carbon atom that is a constituent atom of another cyclic moiety in the main chain and including a carboxylic acid group (—COOH) (hereinafter, a cardo binder); or a combination thereof.

The copolymer includes a first repeating unit derived from the first monomer and a second repeating unit derived from the second monomer, and optionally a third repeating unit derived from the third monomer.

The polymer including the carboxylic acid group may include a multiple aromatic ring-containing polymer. The multiple aromatic ring-containing polymer is known as a cardo binder resin and may commercially available.

The polymer including the carboxylic acid may have an acid value of greater than or equal to about 50 milligrams of potassium hydroxide per gram (mg KOH/g). For example, polymer including the carboxylic acid may have an acid value of greater than or equal to about 60 mg KOH/g, greater than or equal to about 70 mg KOH/g, greater than or equal to about 80 mg KOH/g, greater than or equal to about 90 mg KOH/g, greater than or equal to about 100 mg KOH/g, greater than or equal to about 110 mg KOH/g, greater than or equal to about 120 mg KOH/g, greater than or equal to about 125 mg KOH/g, or greater than or equal to about 130 mg KOH/g. The acid value of the polymer may be for example less than or equal to about 250 mg KOH/g, less than or equal to about for example, 240 mg KOH/g, less than or equal to about 230 mg KOH/g, less than or equal to about 220 mg KOH/g, less than or equal to about 210 mg KOH/g, less than or equal to about 200 mg KOH/g, less than or equal to about 190 mg KOH/g, less than or equal to about 180 mg KOH/g, or less than or equal to about 160 mg KOH/g, but is not limited thereto. The binder polymer may have a weight average molecular weight of greater than or equal to about 1,000 g/mol, for example, greater than or equal to about 2,000 g/mol, greater than or equal to about 3,000 g/mol, or greater than or equal to about 5,000 g/mol. The binder polymer may have a weight average molecular weight of less than or equal to about 100,000 g/mol, for example less than or equal to about 50,000 g/mol.

In the composition, the content of the dispersing agent or the binder polymer may be greater than or equal to about 0.5 wt %, for example, greater than or equal to about 1 wt %, greater than or equal to about 5 wt %, greater than or equal to about 10 wt %, greater than or equal to about 15 wt %, or greater than or equal to about 20 wt % based on a total solid weight of the composition, but is not limited thereto. The content of the dispersing agent or the binder polymer may be less than or equal to about 55 wt %, for example less than or equal to about 40 wt %, less than or equal to about 33 wt %, or less than or equal to about 30 wt % based on a total solid weight of the composition.

In the composition, the polymerizable (e.g., photopolymerizable) monomer including the carbon-carbon double bond may include a (e.g., photopolymerizable) acryl-based monomer. The content of the monomer may be greater than or equal to about 0.5 wt %, for example, greater than or equal to about 1 wt % or greater than or equal to about 2 wt % based on a total solid weight of the composition. The content of the photopolymerizable monomer may be less than or equal to about 50 wt %, for example, less than or equal to about 40 wt %, less than or equal to about 30 wt %, less than or equal to about 28 wt %, less than or equal to about 25 wt %, less than or equal to about 23 wt %, less than or equal to about 20 wt %, less than or equal to about 18 wt %, less than or equal to about 17 wt %, less than or equal to about 16 wt %, or less than or equal to about 15 wt % based on a total solid weight of the composition.

The initiator in the composition may be used for polymerization of the monomers. The initiator is a compound accelerating a radical reaction (e.g., radical polymerization of monomer) by producing radical chemical species under a mild condition (e.g., by heat or light). The initiator may be a thermal initiator or a photo initiator. It is a compound capable of initiating a radical polymerization of the polymerizable acrylic monomer, a thiol compound, or a combination thereof (as described herein) by light. The type of the initiator is not particularly limited and may be appropriately selected.

In the composition, the content of the initiator may be appropriately adjusted taking into consideration types and amounts of the polymerizable monomers. In an embodiment, the initiator may be used in an amount range of about 0.01 wt % to about 10 wt % based on a total weight of the composition, but is not limited thereto.

The composition may further include a (multiple or mono-functional) thiol compound having at least one thiol group at the terminal end, a metal oxide particulate, or a combination thereof.

The metal oxide particulate may include $TiO_2$, $SiO_2$, $BaTiO_3$, $Ba_2TiO_4$, ZnO, or a combination thereof. The metal oxide particulate may have an appropriately selected diameter without a particular limit. The diameter of the metal oxide particulate may be greater than or equal to about 100 nm, for example, greater than or equal to about 150 nm, or greater than or equal to about 200 nm and less than or equal to about 1,000 nm or less than or equal to about 800 nm. In the composition, the content of the metal oxide may be greater than or equal to about 1 wt %, greater than or equal to about 5 wt %, greater than or equal to about 10 wt %, or greater than or equal to about 15 wt % and less than or equal to about 35 wt %, less than or equal to about 30 wt %, less than or equal to about 20 wt %, less than or equal to about 10 wt %, or less than or equal to about 5 wt % based on the solid content of the composition.

The content of the multiple thiol compound may be greater than or equal to about 1 wt %, greater than or equal to about 5 wt %, greater than or equal to about 10 wt %, greater than or equal to about 15 wt %, or greater than or equal to about 20 wt % based on a total solid weight. The content of the multiple thiol compound may be less than or equal to about 50 wt %, less than or equal to about 40 wt %, less than or equal to about 30 wt %, less than or equal to about 25 wt %, less than or equal to about 20 wt %, or less than or equal to about 15 wt % based on a total solid weight.

The composition may further include an organic solvent (or a liquid vehicle). Types of the usable organic solvent are not particularly limited. The types and contents of the organic solvent may be appropriately determined by taking into consideration the aforementioned main components (i.e., the quantum dot, the dispersing agent, the polymerizable monomer, the initiator, and if used, the thiol compound,) and a type and an amount of an additive as described herein. The composition may include a solvent in a residual amount except for a desired content of the (non-volatile) solid. If desired, the composition may further include various additives such as a light diffusing agent, a leveling agent, or a coupling agent in addition to the aforementioned components. The content of the additive is not particularly limited, and may be controlled within an appropriate range wherein the additive does not cause an adverse effect on preparation of the composition and production of the quantum dot-polymer composite and optionally a patterning of the composite.

If used, the additives may be used in an amount of greater than or equal to about 0.1 wt %, for example, greater than or equal to about 0.5 wt %, greater than or equal to about 1 wt %, greater than or equal to about 2 wt %, or greater than or equal to about 5 wt % based on a total weight of the composition, but is not limited thereto. If used, the content of the additives may be less than or equal to about 20 wt %, for example, less than or equal to about 19 wt %, less than or equal to about 18 wt %, less than or equal to about 17 wt %, less than or equal to about 16 wt %, or less than or equal to about 15 wt % based on a total weight of the composition, but is not limited thereto.

Details on the components of the composition and the preparation of the composition may refer to US-2017-0059988-A1, which is incorporated herein by reference in its entirety. The composition may provide a quantum dot-polymer composite (or its pattern) by (e.g., radical) polymerization.

In an embodiment, the quantum dot-polymer composite includes a polymer matrix; and the aforementioned quantum dot dispersed in the polymer matrix.

The polymer matrix may include a dispersing agent (e.g., a binder polymer including a carboxylic acid group), a polymerization product (e.g., insulating polymer) of a polymerizable monomer having a carbon-carbon double bond (at least one, for example, at least two, at least three, at least four, or at least five), optionally a polymerization product of the polymerizable monomer and a multiple thiol compound having at least two thiol groups at the terminal end, or a combination thereof. The quantum dot-polymer composite may further include the aforementioned metal oxide particulate. Two or more of the foregoing (e.g., dispersing agent, polymerization product, metal oxide fine particles) can be present.

In an embodiment, the polymer matrix may include a cross-linked polymer and a dispersing agent (e.g., (carboxyl group-contained) binder polymer). The polymer matrix may not include a conjugated polymer (excepting cardo resin). The cross-linked polymer may include a thiolene resin, a cross-linked poly(meth)acrylate, or a combination thereof. In an embodiment, the cross-linked polymer may be a polymerization product of the polymerizable monomer and, optionally, the multiple thiol compound.

The quantum dot, the dispersing agent, or the binder polymer, the polymerizable monomer, and the multiple thiol compound may be the same as described herein. The contents of quantum dots and metal oxide particulates in the composite may be the aforementioned (based on solid content) contents in the composition. In the composite, the content of the polymer matrix may be greater than or equal to about 3 wt %, greater than or equal to about 5 wt %, greater than or equal to about 10 wt %, greater than or equal to about 15 wt %, or greater than or equal to about 20 wt % and less than or equal to about 97 wt %, less than or equal to about 95 wt %, less than or equal to about 90 wt %, less than or equal to about 80 wt %, or less than or equal to about 70 wt % based on a total weight of the composite.

The film of the quantum dot-polymer composite (or pattern as described herein) may have for example a thickness of less than or equal to about 30 µm, for example, less than or equal to about 25 µm, less than or equal to about 20 µm, less than or equal to about 15 µm, less than or equal to about 10 µm, less than or equal to about 8 µm, or less than or equal to about 7 µm and greater than about 2 µm, for example, greater than or equal to about 3 µm, greater than or equal to about 3.5 µm, greater than or equal to about 4 µm, greater than or equal to about 5 µm, or greater than or equal to about 6 µm.

In an embodiment, a display device includes a light source and a photoluminescent element, and the photoluminescent element includes a light emitting layer, and the light emitting layer includes a film or patterned film of the quantum dot-polymer composite. The light emitting layer may be disposed on a (e.g., transparent) substrate. The light source is configured to provide the photoluminescent element with incident light. The incident light may have a photoluminescence peak wavelength of greater than or equal to about 440 nm, for example, greater than or equal to about 450 nm and less than or equal to about 500 nm, for example, less than or equal to about 480 nm, less than or equal to about 470 nm, or less than or equal to about 460 nm.

Figure 2:
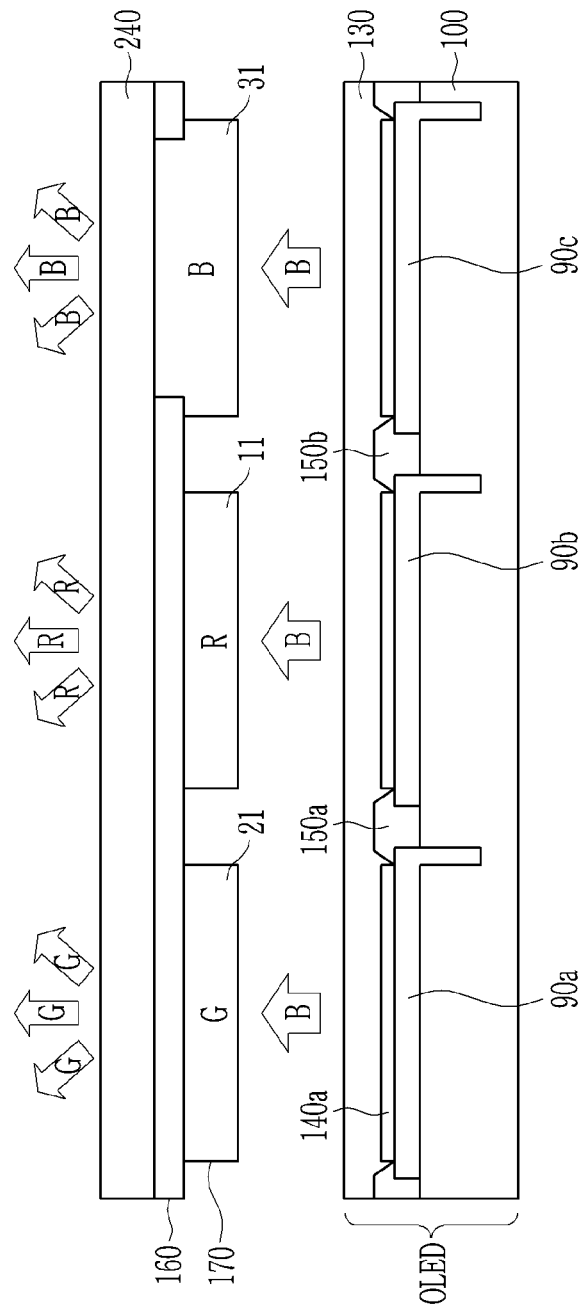
FIG. 2 is an exploded view of an embodiment of a device.

In an embodiment, the photoluminescent element may include a sheet of the quantum dot-polymer composite. The display device may further include a liquid crystal panel and the sheet of the quantum dot-polymer composite may be disposed between the light source and the liquid crystal panel. FIG. 2 shows an exploded view of a non-limiting display device. Referring to FIG. 2, the display device may have a structure wherein a reflector, a light guide panel (LGP) and a blue LED light source (Blue-LED), the aforementioned quantum dot-polymer composite sheet (QD sheet), for example, various optical films such as a prism, a double brightness enhance film (DBEF), and the like are stacked and a liquid crystal panel is disposed thereon.

In the device of an embodiment, the light emitting layer may include a pattern of the quantum dot-polymer composite. The pattern may include at least one repeating section to emit light at a predetermined wavelength. The pattern of the quantum dot-polymer composite may include a first section to emit first light and a second section to emit second light. The pattern of the quantum dot-polymer composite may be produced by photolithography or inkjet.

The first light and the second light have different maximum emission peak wavelengths in a photoluminescence spectrum. In an embodiment, the first light may be red light having a maximum emission peak wavelength of about 600 nm to about 650 nm (e.g., about 620 nm to about 650 nm), and the second light may be green light having a maximum emission peak wavelength of about 500 nm to about 550 nm (e.g., about 510 nm to about 550 nm) or vice versa (i.e., the first light is green light and the second light is red light). The pattern may further include a third section that emits or passes third light (e.g., blue light) that is different from the first light and the second light. The third light may have a maximum peak wavelength ranging from about 380 nm to about 480 nm.

Optical elements (blue light blocking layer or first optical filter as described herein) for blocking (e.g., reflecting or absorbing) blue light may be disposed on front surfaces (light-emitting surfaces) of the first section and the second section.

In the aforementioned display device, the light source includes a plurality of light emitting units respectively corresponding to the repeating sections (e.g., first section and second section), and the light emitting units may include a first electrode and a second electrode facing each other and an electroluminescent layer disposed between the first electrode and the second electrode. The electroluminescent layer may include an organic light emitting material. For example, each light emitting unit of the light source may include an electroluminescent device (e.g., an organic light emitting diode (OLED)) structured to emit light of a predetermined wavelength (e.g., blue light, green light, or a combination thereof). Structures and materials of the electroluminescent device and the organic light emitting diode (OLED) are not particularly limited. The light source includes an organic light emitting diode (OLED) emitting blue light (and optionally, green light).

Figure 3:
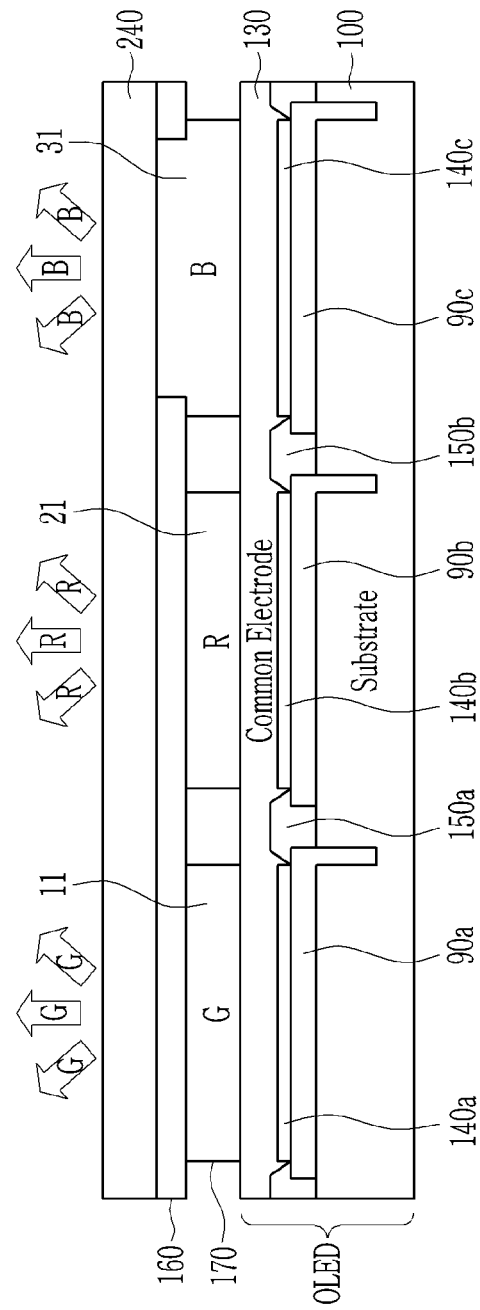
FIG. 3 is a schematic view showing a cross section of an embodiment of a device.

FIG. 2 is a schematic cross-sectional view of a display devices according to an embodiment and FIG. 3 is a schematic cross-sectional view of a display devices according to an embodiment. Referring to FIGS. 2 and 3, a light source includes an organic light emitting diode (OLED) emitting blue light. The organic light emitting diode (OLED) may include at least two pixel electrodes 90a, 90b, 90c formed on a substrate 100, a pixel defining layer 150a, 150b formed between the adjacent pixel electrodes 90a, 90b, 90c, an organic light emitting layer 140a, 140b, 140c formed on the pixel electrodes 90a, 90b, 90c, and a common electrode layer 130 formed on the organic light emitting layer 140a, 140b, 140c.

A thin film transistor and a substrate may be disposed under the organic light emitting diode (OLED).

A stacked structure including a quantum dot-polymer composite (e.g., first section including red quantum dot and second section including green quantum dot) pattern and a substrate may be disposed on the light source. Blue light emitted from the light source is entered into the first section and the second section configured to emit red light and green light, respectively. Blue light emitted from the light source may pass through the third section.

The light (e.g., blue light) emitted from the light source may enter the second section 21 and the first section 11 of the pattern 170 to emit (e.g., converted) red light R and green light G, respectively. The blue light B emitted from the light source passes through or transmits from the third section 31. Over the second section emitting red light, the first section emitting green light, or a combination thereof, an optical element 160 may be disposed. The optical element may be a blue cut layer which cuts (e.g., reflects or absorbs) blue light and optionally green light, or a first optical filter. The blue cut layer 160 may be disposed on the upper substrate 240. The blue cut layer 160 may be disposed between the upper substrate 240 and the quantum dot-polymer composite pattern and over the first section 11 and the second section 21. Details of the blue cut layer may be the same as set forth for the first optical filter 310.

The device may be obtained by separately producing the stacked structure and (e.g., blue light emitting) LED or OLED and then assembling the same. The device may be obtained by forming a quantum dot-polymer composite pattern directly on the LED or OLED.

The substrate may be a substrate including an insulating material. The substrate may include glass; various polymers such as a polyester (e.g., polyethylene terephthalate (PET) polyethylene naphthalate (PEN), a polymethacrylate, or a polyacrylate); a polycarbonate; a polysiloxane (e.g., polydimethylsiloxane (PDMS)); an inorganic material such as $Al_2O_3$ or ZnO; or a combination thereof, but is not limited thereto. A thickness of the substrate may be selected appropriately taking into consideration a substrate material but is not particularly limited. The substrate may have flexibility. The substrate may have a transmittance of greater than or equal to about 50%, greater than or equal to about 60%, greater than or equal to about 70%, greater than or equal to about 80%, or greater than or equal to about 90% for light emitted from the quantum dot.

A wire layer including a thin film transistor or the like is formed on the substrate. The wire layer may further include a gate line, a sustain voltage line, a gate insulating layer, a data line, a source electrode, a drain electrode, a semiconductor, a protective layer, and the like. The detail structure of the wire layer may vary depending on an embodiment. The gate line and the sustain voltage line are electrically separated from each other, and the data line is insulated and crossing the gate line and the sustain voltage line. The gate electrode, the source electrode, and the drain electrode form a control terminal, an input terminal, and an output terminal of the thin film transistor, respectively. The drain electrode is electrically connected to the pixel electrode as described herein.

The pixel electrode may function as an anode of the display device. The pixel electrode may be formed of a transparent conductive material such as indium tin oxide (ITO) or indium zinc oxide (IZO). The pixel electrode may be formed of a material having a light-blocking properties such as gold (Au), platinum (Pt), nickel (Ni), tungsten (W), chromium (Cr), molybdenum (Mo), iron (Fe), cobalt (Co), copper (Cu), palladium (Pd), or titanium (Ti). The pixel electrode may have a two-layered structure in which the transparent conductive material and the material having light-blocking properties are stacked sequentially.

Between two adjacent pixel electrodes, a pixel define layer (PDL) overlapped with a terminal end of the pixel electrode to divide the pixel electrode into a pixel unit. The pixel define layer is an insulation layer which may electrically block the at least two pixel electrodes.

The pixel define layer covers a portion of the upper surface of the pixel electrode, and the remaining region of the pixel electrode not covered by the pixel define layer may provide an opening. An organic light emitting layer as described herein may be formed on the region defined by the opening.

The organic light emitting layer defines each pixel area by the pixel electrode and the pixel define layer. In other words, one pixel area may be defined as an area formed with one organic emission unit layer which is contacted with one pixel electrode divided by the pixel define layer.

For example, in the display device according to an embodiment, the organic light emitting layer may be defined as a first pixel area, a second pixel area and a third pixel area, and each pixel area is spaced apart from each other leaving a predetermined interval by the pixel define layer.

In an embodiment, the organic light emitting layer may emit a third light belong to visible light region or belong to UV region. That is, each of the first to the third pixel areas of the organic light emitting layer may emit third light. In an embodiment, the third light may be a light having the highest energy in the visible light region, for example, may be blue light. When all pixel areas of the organic light emitting layer are designed to emit the same light, each pixel area of the organic light emitting layer may be all formed of the same or similar materials or may show the same or similar properties. A process difficulty of forming the organic light emitting layer may be decreased, and the display device may be applied for, e.g., formed by or used in, a large scale/large area process. However, the organic light emitting layer according to an embodiment is not necessarily limited thereto, but the organic light emitting layer may be designed to emit at least two different lights.

The organic light emitting layer includes an organic emission unit layer in each pixel area, and the each organic emission unit layer may further include an auxiliary layer (e.g., hole injection layer, hole transport layer, electron transport layer, etc.) besides the light emitting layer.

The common electrode may function as a cathode of the display device. The common electrode may be formed of a transparent conductive material such as indium tin oxide (ITO) or indium zinc oxide (IZO). The common electrode may be formed on the organic light emitting layer and may be integrated therewith.

A planarization layer or a passivation layer (not shown) may be formed on the common electrode. The planarization layer may include a (e.g., transparent) insulating material for providing, e.g., ensuring, electrical insulation with the common electrode.

In an embodiment, the display device may further include a lower substrate, a polarizing plate disposed under the lower substrate, and a liquid crystal layer disposed between the stacked structure and the lower substrate, and in the stacked structure, the photoluminescent layer may be disposed to face the liquid crystal layer. The display device may further include a polarizing plate between the liquid crystal layer and the photoluminescent layer. The light source may further include LED and if necessary, a light guide panel.

Figure 4:
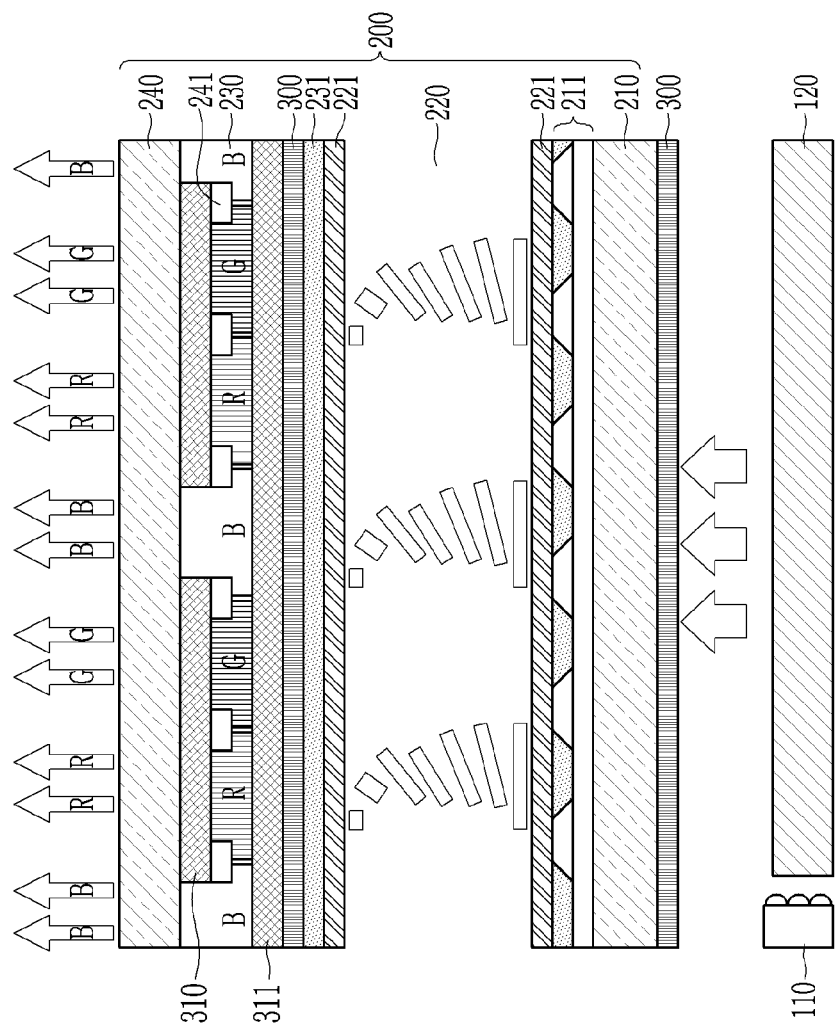
FIG. 4 is a schematic view showing a cross section of an embodiment of a display device.

Non-limiting examples of the display device (e.g., a liquid crystal display device) according to an embodiment are illustrated with a reference to a drawing. FIG. 4 is a schematic cross sectional view showing a liquid crystal display according to an embodiment. Referring to FIG. 4, the display device of an embodiment includes a liquid crystal panel 200, a polarizing plate 300 disposed under the liquid crystal panel 200, and a backlight unit (BLU) disposed under the polarizing plate 300.

The liquid crystal panel 200 includes a lower substrate 210, a stacked structure, and a liquid crystal layer 220 disposed between the stacked structure and the lower substrate. The stacked structure includes a transparent substrate 240 and a photoluminescent layer 230 including a pattern of a quantum dot-polymer composite.

The lower substrate 210 that is also referred to as an array substrate may be a transparent insulating material substrate. The substrate may be the same as described herein. A wire plate 211 is provided on an upper surface of the lower substrate 210. The wire plate 211 may include a plurality of gate wires (not shown) and data wires (not shown) that define a pixel area, a thin film transistor disposed adjacent to a crossing region of gate wires and data wires, and a pixel electrode for each pixel area, but is not limited thereto. Details of such a wire plate are not particularly limited.

The liquid crystal layer 220 may be disposed on the wire plate 211. The liquid crystal layer 220 may include an alignment layer 221 on and under the layer 220 to initially align the liquid crystal material included therein. Details (e.g., a liquid crystal material, an alignment layer material, a method of forming liquid crystal layer, a thickness of liquid crystal layer, or the like) of the liquid crystal material and the alignment layer are not particularly limited.

A lower polarizing plate 300 is provided under the lower substrate. Materials and structures of the polarizing plate 300 are not particularly limited. A backlight unit (e.g., emitting blue light) may be disposed under the polarizing plate 300.

An upper optical element or an upper polarizing plate 300 may be provided between the liquid crystal layer 220 and the transparent substrate 240, but is not limited thereto. For example, the upper polarizing plate may be disposed between the liquid crystal layer 220 and the photoluminescent layer 230. The polarizing plate may be any polarizer that used in a liquid crystal display device. The polarizing plate may be TAC (triacetyl cellulose) having a thickness of less than or equal to about 200 μm, but is not limited thereto. In an embodiment, the upper optical element may be a coating that controls a refractive index without a polarization function.

The backlight unit includes a light source 110. The light source may emit blue light or white light. The light source may include a blue LED, a white LED, a white OLED, or a combination thereof, but is not limited thereto.

The backlight unit may further include a light guide panel 120. In an embodiment, the backlight unit may be an edge-type lighting. For example, the backlight unit may include a reflector (not shown), a light guide panel (not shown) provided on the reflector and providing a planar light source with the liquid crystal panel 200, at least one optical sheet (not shown) on the light guide panel, for example, a diffusion plate, a prism sheet, and the like, or a combination thereof, but is not limited thereto. The backlight unit may not include a light guide panel. In an embodiment, the backlight unit may be a direct lighting. For example, the backlight unit may have a reflector (not shown), and may have a plurality of fluorescent lamps disposed on the reflector at regular intervals, or may have an LED operating substrate on which a plurality of light emitting diodes may be disposed, a diffusion plate thereon, and optionally at least one optical sheet. Details (e.g., each component of a light emitting diode, a fluorescent lamp, light guide panel, various optical sheets, and a reflector) of such a backlight unit are not particularly limited.

A black matrix 241 is provided under the transparent substrate 240 and the black matrix 241 has openings and hides a gate line, a data line, and a thin film transistor of the wire plate on the lower substrate. For example, the black matrix 241 may have a lattice shape. The photoluminescent layer 230 is provided in the openings of the black matrix 241 and has a quantum dot-polymer composite pattern including a first section (R) configured to emit first light (e.g., red light), a second section (G) configured to emit second light (e.g., green light), and a third section (B) configured to emit/transmit, for example blue light. If desired, the photoluminescent layer may further include at least one fourth section. The fourth section may include a quantum dot that emits different color from light emitted from the first to third sections (e.g., cyan, magenta, and yellow light).

In the photoluminescent layer 230, sections forming a pattern may be repeated corresponding to pixel areas formed on the lower substrate. A transparent common electrode 231 may be provided on the photoluminescent color filter layer.

The third section (B) configured to emit/transmit blue light may be a transparent color filter that does not change a photoluminescence spectrum of the light source. In this case, blue light emitted from the backlight unit may enter in a polarized state and may be emitted through the polarizing plate and the liquid crystal layer as it is. If desired, the third section may include a quantum dot emitting blue light.

If desired, the display device may further include a light blocking layer (blue cut filter) or a first optical filter layer. The blue light blocking layer may be disposed between the bottom surfaces of the first section (R) and the second section (G) and the upper substrate 240 or on the top surface of the upper substrate 240. The blue light blocking layer may include a sheet having openings that correspond to a pixel area showing a blue color (e.g., third section) and may be formed on portions corresponding to the first and second sections. As shown in FIG. 4, the first optical filter layer may be integrally formed as one body structure at the portions except portions overlapped with the third section, but is not limited thereto. At least two first optical filter layers may be spaced apart and be disposed on each of the portions overlapped with the first and the second sections.

For example, the first optical filter layer may block light having a portion of a wavelength region in the visible light region and transmit light having other wavelength regions. For example, the first optical filter layer may block blue light and transmit light except blue light. For example, the first optical filter layer may transmit green light, red light, or yellow light that is mixed light thereof.

For example, the first optical filter layer may block blue light having a wavelength of less than or equal to about 500 nm and may transmit light in other visible light wavelength region of greater than about 500 nm and less than or equal to about 700 nm.

For example, the first optical filter layer may have light transmittance of greater than or equal to about 70%, greater than or equal to about 80%, greater than or equal to about 90%, or about 100% with respect to the other visible light of greater than about 500 nm and less than or equal to about 700 nm.

The first optical filter layer may include a polymer thin film including a dye, a pigment, or a combination thereof that absorbs light having a wavelength to be blocked. The first optical filter layer may absorb at least 80%, at least 90%, or at least 95% of blue light having a wavelength of less than or equal to about 480 nm and the first optical filter layer may have light transmittance of greater than or equal to about 70%, greater than or equal to about 80%, greater than or equal to about 90%, or about 100% with respect to other visible light of greater than about 500 nm and less than or equal to about 700 nm.

The first optical filter layer may block (e.g., absorb) blue light having a wavelength of less than or equal to about 500 nm and for example may selectively transmit green light or red light. In this case, at least two first optical filter layers may be spaced apart and disposed on each of the portions overlapped with the first and second sections, respectively. For example, a first optical filter layer selectively transmitting red light may be disposed on the portion overlapped with the section emitting red light and the first optical filter layer selectively transmitting green light may be disposed on the portion overlapped with the section emitting green light, respectively. For example, the first optical filter layer may include a first region, a second region, or a combination thereof, wherein the first region blocks (e.g., absorb) blue light and red light and transmits light having a wavelength of a predetermined range (e.g., greater than or equal to about 500 nm, greater than or equal to about 510 nm, or greater than or equal to about 515 nm and less than or equal to about 550 nm, less than or equal to about 545 nm, less than or equal to about 540 nm, less than or equal to about 535 nm, less than or equal to about 530 nm, less than or equal to about 525 nm, or less than or equal to about 520 nm) and the second region blocks (e.g., absorb) blue light and green light and transmits light having a wavelength of a predetermined range (e.g., greater than or equal to about 600 nm, greater than or equal to about 610 nm, or greater than or equal to about 615 nm and less than or equal to about 650 nm, less than or equal to about 645 nm, less than or equal to about 640 nm, less than or equal to about 635 nm, less than or equal to about 630 nm, less than or equal to about 625 nm, or less than or equal to about 620 nm). The first region may overlap with the section emitting green light and the second region may overlap with the section emitting red light. The first region and the second region may be optically isolated. The first optical filter layer may contribute to improving color purity of a display device.

The first optical filter layer may be a reflective filter including a plurality of layers (e.g., inorganic material layers) with different reflective index. For example two layers having different reflective index may be alternately stacked with each other, or for example a layer having a high reflective index and a layer having a low reflective index may be alternately stacked with each other.

As refractive index different between the layer having a high refractive index and the layer having a low refractive index is higher, the first optical filter layer having higher wavelength selectivity may be provided. A thickness of each of the layer having a high refractive index and the layer having a low refractive index and the number of stacked layers thereof may be determined according to a refractive index of each layer and a reflected wavelength, for example, each layer having a high refractive index may have a thickness of about 3 nm to about 300 nm, and each layer having a low refractive index may have a thickness of about 3 nm to about 300 nm.

A total thickness of the first optical filter layer may be, for example, from about 3 nm to about 10,000 nm, about 300 nm to about 10,000 nm, or about 1,000 nm to about 10,000 nm. All layers having a high refractive index may have the same thickness and the same material or different from each other, and all layers having a low refractive index may have the same thickness and the same material or different thickness and materials from each other.

The display device may further include a second optical filter layer 311 (e.g., red/green or yellow light recycling layer) disposed between the photoluminescent layer and the liquid crystal layer (e.g., between photoluminescent layer and upper polarizer) and transmitting at least a portion of the third light and reflecting at least a portion of the first light and the second light. The second optical filter layer may reflect light in a wavelength region of greater than about 500 nm. The first light may be red light, the second light may be green light, and the third light may be blue light.

In the display device according to an embodiment, the second optical filter layer may be formed as an integrated one layer having a relatively planar surface.

In an embodiment, the second optical filter layer may include a monolayer having a low refractive index, for example, the second optical filter layer may be a transparent thin film having a refractive index of less than or equal to about 1.4, less than or equal to about 1.3, or less than or equal to about 1.2.

The second optical filter layer having a low refractive index may be, for example, a porous silicon oxide, a porous organic material, a porous organic/inorganic composite, or a combination thereof.

In an embodiment, the second optical filter layer may include a plurality of layers having different refractive indexes, for example, the second optical filter layer may be formed by alternately stacking two layers having different refractive indexes, or for example, the second optical filter layer may be formed by alternately stacking material having a high refractive index and material having a low refractive index.

The layer having a high refractive index in the second optical filter layer may include, for example, hafnium oxide, tantalum oxide, titanium oxide, zirconium oxide, magnesium oxide, cesium oxide, lanthanum oxide, indium oxide, niobium oxide, aluminum oxide, and nitride, or a combination thereof, and according to an embodiment, layer having a high refractive index in the second optical filter layer may include a variety of materials having a higher refractive index than the layer having a low refractive index.

The layer having a low refractive index in the second optical filter layer may include, for example, a silicon oxide, and according to an embodiment, layer having a low refractive index in the second optical filter layer may include a variety of materials having a lower refractive index than the layer having a high refractive index.

As the refractive index difference between the layer having a high refractive index and the layer having a low refractive index is the higher, the second optical filter layer may have the higher wavelength selectivity.

In the second optical filter layer, a thickness of each of the layer having a high refractive index and the layer having a low refractive index and the number of stacked layers thereof may be determined depending upon a refractive index of each layer and the reflected wavelength, for example, each layer having a high refractive index in the second optical filter layer may have a thickness of about 3 nm to about 300 nm, and each layer having a low refractive index in the second optical filter layer may have a thickness of about 3 nm to about 300 nm. A total thickness of the second optical filter layer may be, for example, from about 3 nm to about 10,000 nm, about 300 nm to about 10,000 nm, or about 1,000 nm to about 10,000 nm. Each of the layer having a high refractive index and the layer having a low refractive index in the second optical filter layer may have the same thickness and materials or different thickness and materials from each other.

The second optical filter layer may reflect at least a portion of the first light (R) and the second light (G) and transmits at least a portion (e.g., whole part) of the third light (B). For example, the second optical filter layer 140 may transmit only the third light (B) in a blue light wavelength region of less than or equal to about 500 nm and light in a wavelength region of greater than about 500 nm, that is, green light (G), yellow light, red light (R), and the like may be not passed through the second optical filter layer and reflected. Thus the reflected green light and red light may pass through the first and the second sections to be emitted to the outside of the display device 10.

The second optical filter layer may reflect a wavelength region of greater than about 500 nm in greater than or equal to about 70%, greater than or equal to about 80%, or greater than or equal to about 90%, or about 100%.

Meanwhile, the second optical filter layer may have a transmittance to a wavelength region of less than or equal to about 500 nm of, for example, greater than or equal to about 90%, greater than or equal to about 92%, greater than or equal to about 94%, greater than or equal to about 96%, greater than or equal to about 98%, greater than or equal to about 99%, or about 100%.

In an embodiment, the aforementioned quantum dot-polymer composite pattern may be produced by a method using the photoresist composition. The method may include forming a film of the aforementioned composition on a substrate; exposing a selected region of the film to light (e.g., a wavelength of less than or equal to about 400 nm); and developing the exposed film with an alkali developing solution to obtain a pattern of the quantum dot-polymer composite.

Figure 5:
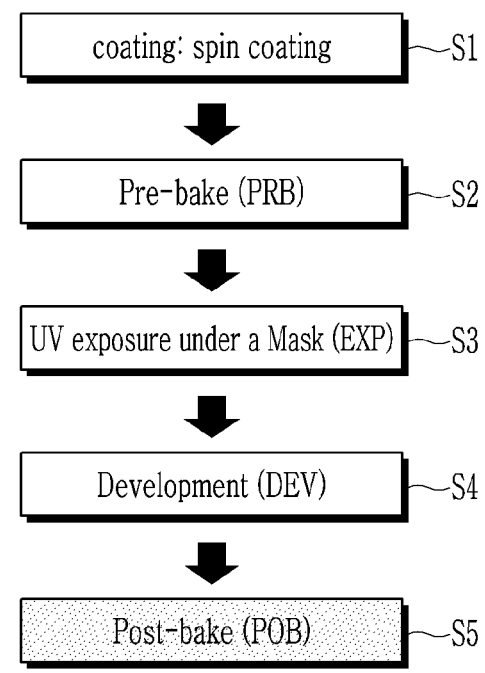
FIG. 5 is a schematic view showing an embodiment of a pattern forming process using a composition.
Figure 5:
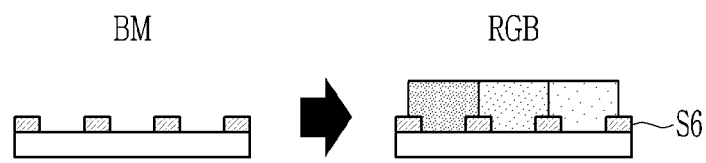

The substrate and the composition may be the same as described herein. Non-limiting methods of forming the aforementioned pattern are illustrated, referring to FIG. 5.

The composition is coated to have a predetermined thickness on a substrate in an appropriate method of spin coating, slit coating, and the like (S1). The formed film may be, optionally, pre-baked (PRB) (S2). The pre-baking may be performed by selecting appropriate conditions of temperature, time, atmosphere, and the like.

The formed (or optionally pre-baked) film is exposed to light having a predetermined wavelength under a mask having a predetermined pattern (S3). A wavelength and intensity of the light may be selected taking into consideration types and amounts of the photoinitiator, types and amounts of the quantum dots, and the like.

The exposed film is treated with an alkali developing solution (e.g., dipping or spraying) to dissolve an unexposed region and obtain a desired pattern (S4). The obtained pattern may be, optionally, post-baked (FOB) to improve crack resistance and solvent resistance of the pattern, for example, at about 150° C. to about 230° C. for a predetermined time (e.g., greater than or equal to about 10 minutes or greater than or equal to about 20 minutes) (S5).

The quantum dot-polymer composite including the quantum dot of an embodiment may exhibit a blue light conversion rate of greater than or equal to about 29%, for example, greater than or equal to about 30%, or greater than or equal to about 31%, for example, after 30 minutes heat treatment at 180° C.

In an embodiment in which the quantum dot-polymer composite pattern has a plurality of repeating sections, a quantum dot-polymer composite having a desired pattern may be obtained by preparing a plurality of compositions including a quantum dot having desired photoluminescence properties (a photoluminescence peak wavelength and the like) to form each repeating section (e.g., a red light emitting quantum dot, a green quantum dot, or optionally, a blue quantum dot) and repeating formation of a pattern for each composition an appropriate number of times (e.g., twice or more or three times or more) (S6). For example, the quantum dot-polymer composite may have, e.g., be provided in, a pattern including at least two repeating color sections (e.g., RGB sections). The quantum dot-polymer composite pattern may be used as a photoluminescence-type color filter in a display device.

In an embodiment, the aforementioned stacked structure may be produced using an ink composition. The method may include depositing the same (e.g., to provide a desirable pattern) on the desirable substrate using an appropriate system (e.g., droplet discharging device such as inkjet or nozzle printing device) and heating the same to remove a solvent and to perform a polymerization. The method may provide a highly precise quantum dot-polymer composite film or pattern in a simple way for a short time.

An embodiment provides an electronic device including the aforementioned quantum dot. The device may include a light emitting diode (LED), an organic light emitting diode (OLED), a sensor, a solar cell, an imaging sensor, or a liquid crystal display (LCD), but is not limited thereto.

Hereinafter, the embodiments are illustrated in more detail with reference to examples. However, they are exemplary embodiments of the present invention, and the present invention is not limited thereto.

EXAMPLES

Analysis Methods
1. Ultraviolet-Visible (UV-Vis) Spectroscopy
UV spectroscopy is performed by using an Agilent Cary5000 spectrometer to obtain a UV-Visible absorption spectrum.
2. Photoluminescence Analysis
A Hitachi F-7000 spectrometer is used to obtain photoluminescence (PL) spectra of the produced quantum dots at excitation wavelength of 450 nanometers (nm).
3. ICP Analysis
Shimadzu ICPS-8100 is used to perform inductively coupled plasma-atomic emission spectrometry (ICP-AES).
4. Optical Density (OD) per Unit Weight at Wavelength of 450 nm
Synthesized quantum dot (QD) particles are washed, and then the QD powder is weighed. Then, (b) grams of toluene is added to (a) grams of the QD powder to prepare a QD solution ((a)+(b) grams).
The QD solution is diluted with toluene (n) times and then, put in a 1 centimeter (cm) quartz cuvette, and an Agilent Cary5000 spectrometer is used to perform an UV spectroscopy. In the measured UV spectrum, an absorbance at a wavelength of 450 nm is measured and used to obtain total OD according to the following formula:

Total OD=Absorbance×(n)×((a)+(b)) grams.

The obtained total OD is divided by the dry QD powder weight (b) (i.e., absorbance×number of dilutions (n)×(QD+gram of solvent)/gram of QD) to obtain optical density per QD unit weight.

Example 1

Indium acetate and palmitic acid are dissolved in 1-octadecene in a 200 milliliter (mL) reaction flask and then, heated at 120° C. under vacuum. The indium and the palmitic acid are used in a mole ratio of 1:3. An atmosphere of the reactor is converted into nitrogen after predetermined time. The temperature inside the flask is adjusted into less than or equal to 100° C., and a mixed solution of tris(trimethylsilyl)phosphine (TMS3P) and trioctylphosphine is rapidly injected thereinto and then, reacted for about 5 minutes. Subsequently, zinc oleate (Zn(OA)$_2$) as a zinc precursor is injected into the reactor. Then, the temperature of the reactor is increased into greater than or equal to 180° C., a GaCl$_3$-trioctylphosphine (TOP) solution is injected several times into the reactor, and the GaCl$_3$-TOP solution and TMS3P as a phosphorus precursor are injected several times thereinto to perform a reaction for 2 hours or more.
Subsequently, the reaction solution is cooled down to room temperature, acetone is added thereto and then, centrifuged, and precipitates including a multi-component core having an InP(Zn)/GaP composition are dispersed again in toluene.
TMS3P, the Zn precursor, and the Ga precursor are respectively used in an amount of 0.8 mole, 1.0 mole, and 0.1 mole based on 1 mole of indium. A transmission electron microscopy (TEM) analysis, a UV-Vis spectroscopy, a PL analysis, and an OD measurement are performed with respect to the obtained multi-component core. The results are shown in Tables 1 and 2.

Example 2

A multi-component core is manufactured according to the same method as Example 1 except that TMS3P, the Zn precursor, and the Ga precursor are respectively used in an amount of 0.85 mole, 1.0 mole, and 0.2 moles based on 1 mole of indium. A TEM analysis, UV-Vis spectroscopy, a PL analysis, and an OD measurement are performed with respect to the obtained multi-component core. The results are summarized in Tables 1 and 2.

Example 3

A multi-component core is manufactured according to the same method as Example 1 except that TMS3P, the Zn precursor, and the Ga precursor are respectively used in an amount of 0.9 mole, 1.0 mole, and 0.4 mole based on 1 mole of indium. A TEM analysis, UV-Vis spectroscopy, a PL analysis, and an OD measurement are performed with respect to the obtained multi-component core. The results are summarized in Tables 1 and 2.

Example 4

A multi-component core is manufactured according to the same method as Example 1 except that TMS3P, the Zn precursor, and the Ga precursor are respectively used in an amount of 1.05 mole, 1.0 mole, and 0.6 mole based on 1 mole of indium. A TEM analysis, UV-Vis spectroscopy, a PL analysis, and an OD measurement are performed with respect to the obtained multi-component core. The results are summarized in Tables 1 and 2.

Example 5

A multi-component core is manufactured according to the same method as Example 1 except that TMS3P, the Zn precursor, and the Ga precursor are respectively used in an amount of 1.15 mole, 1.0 mole, and 0.8 mole based on 1 mole of indium. A TEM analysis, UV-Vis spectroscopy, a PL analysis, and an OD measurement are performed with respect to the obtained multi-component core. The results are summarized in Tables 1 and 2.

Comparative Example 1

A multi-component core is manufactured according to the same method as Example 1 except that TMS3P and the Zn precursor are respectively used in an amount of 0.75 mole and 1.0 mole based on 1 mole of indium, and the Ga precursor is not used. A TEM analysis, UV-Vis spectroscopy, a PL analysis, and an OD measurement of the obtained multi-component core are performed with respect to the obtained multi-component core. The results are summarized in Tables 1 and 2.

Comparative Example 2

A multi-component core is manufactured according to the same method as Example 1 except that the phosphorus precursor is not additionally used during the injection of the gallium precursor. A TEM analysis, UV-Vis spectroscopy, a PL analysis, and an OD measurement of the obtained multi-component core are performed with respect to the obtained multi-component core. The results are summarized in Tables 1 and 2.

TABLE 1

|  | Moles Ga precursor:Moles In | First absorption peak (nm)t | Core size (nm) | OD at 450 nm per gram |
| --- | --- | --- | --- | --- |
| Comparative Example 1 | 0:1 | 432 | 1.96 ± 0.6 | 1,039 |
| Example 1 | 0.1:1 | 428 | 2.52 ± 1.0 | 1,458 |
| Example 2 | 0.2:1 | 437 | 2.52 ± 1.1 | 2,773 |
| Example 3 | 0.4:1 | 435 | 2.71 ± 1.0 | 1,552 |
| Example 4 | 0.6:1 | 435 | 2.73 ± 1.2 | 1,370 |
| Example 5 | 0.8:1 | 437 | 2.74 ± 1.3 | 1,455 |

TABLE 1-continued

|  | Moles Ga precursor:Moles In | First absorption peak (nm)t | Core size (nm) | OD at 450 nm per gram |
| --- | --- | --- | --- | --- |
| Comparative Example 2 | 0.2:1 | 429 | 2.12 ± 1.7 | 715 |

TABLE 2

|  | P:In | Zn:In | Ga:(In | (In + Ga):In | Zn:(In + Ga) |
| --- | --- | --- | --- | --- | --- |
| Comparative Example 1 | 0.66:1 | 0.44:1 | 0:1 | 1:1 | 0.44:1 |
| Example 1 | 0.74:1 | 0.34:1 | 0.03:1 | 1.03:1 | 0.33:1 |
| Example 2 | 0.75:1 | 0.34:1 | 0.1:1 | 1.1:1 | 0.31:1 |
| Example 3 | 0.85:1 | 0.25:1 | 0.2:1 | 1.2:1 | 0.21:1 |
| Example 4 | 0.76:1 | 0.16:1 | 0.4:1 | 1.4:1 | 0.11:1 |
| Example 5 | 0.86:1 | 0.16:1 | 0.5:1 | 1.5:1 | 0.11:1 |
| Comparative Example 2 | 0.70:1 | 0.28:1 | 0.12:1 | 1.12:1 | 0.25:1 |

Referring to the results, the quantum dots of examples satisfy the composition ratio disclosed herein and may exhibit increased OD at 450 nm per 1 g of the quantum dots.

Example 6

1. A Se/TOP stock solution is prepared by dispersing selenium in trioctylphosphine, and a S/TOP stock solution is prepared by dispersing sulfur in trioctylphosphine.

Zinc acetate and oleic acid are dissolved in trioctylamine in a 200 mL reaction flask and vacuum-treated at 120° C. for 10 minutes. After internally substituting the reaction flask with $N_2$, while the temperature of the obtained solution is increased up to 320° C., the toluene dispersion of the multi-component core in Example 3 is added thereto, and a predetermined amount of Se/TOP is injected into the reaction flask by several injections. A reaction is performed to obtain a reaction solution including particles having a ZnSe shell disposed on a core. A total reaction time is about 100 minutes, and a total amount of Se used is 8 moles based on 1 mole of indium.

Subsequently, at the reaction temperature, the S/TOP stock solution is injected into the reaction solution. A reaction is performed to obtain a reaction solution including particles having a ZnS shell disposed on the ZnSe shell. A total reaction time is 40 minutes, and a total amount of S used is about 18 moles based on 1 mole of indium.

An excess amount of ethanol is added to the reactant including the obtained multi-component core/shell quantum dots. After centrifugation, a supernatant is discarded therefrom, and precipitates therein are dried and dispersed in chloroform or toluene to obtain a quantum dot solution (hereinafter, a QD solution).

2. A TEM analysis, an ICP analysis, UV-Vis spectroscopy, and a PL analysis are performed with respect to the obtained core-shell quantum dots. The results are summarized as follows.

TABLE 3

|  | P:In | S:In | Zn:In | Se:In | Ga:In | P:(In + Ga) | Zn:(Ga + In) |
| --- | --- | --- | --- | --- | --- | --- | --- |
| Example 6 | less than about 1:1 | 12.3:1 | 45.58:1 | 23.2:1 | 0.3:1 | about 0.769:1 | 35:1 |

While this disclosure has been described in connection with what is presently considered to be practical example embodiments, it is to be understood that the invention is not limited to the disclosed embodiments. On the contrary, it is intended to cover various modifications and equivalent arrangements included within the spirit and scope of the appended claims.

What is claimed is:

1. A method of producing a quantum dot having a multi-component core, comprising:
   forming the multi-component core,
   wherein the forming the multi-component core comprises
   reacting an indium precursor with a phosphorus precursor at a first reaction temperature in an organic solvent in the presence of an organic ligand to form first particles comprising a first semiconductor nanocrystal, the first semiconductor nanocrystal comprising indium and phosphorus;
   adding a zinc precursor to the first particles at a temperature equal to or less than the first reaction temperature to form a zinc-containing coating on a surface of the first particles, whereby providing a reaction system that comprises second particles on which the zinc-containing coating is formed; and
   adding a gallium precursor and a phosphorus precursor to the reaction system that comprises the second particles while heating the reaction system to a second reaction temperature to form a second semiconductor nanocrystal on the second particles to obtain a multi-component core, whereby producing the quantum dot having the multi-component core,
   wherein the second reaction temperature is higher than the first reaction temperature,
   wherein the quantum dot emits green light, and
   wherein in the quantum dot a mole ratio of phosphorus relative to indium is greater than or equal to about 0.6:1 and less than or equal to about 1.0:1, and a mole ratio of phosphorus relative to a sum of indium and gallium is greater than or equal to about 0.5:1 and less than or equal to about 0.8:1.

2. The method of claim 1, wherein the forming the multi-component core is performed by one-pot synthesis without separation of the produced particles.

3. The method of claim 1, wherein the first reaction temperature is less than or equal to about 150° C. and the second reaction temperature is greater than or equal to about 160° C. and less than or equal to about 280° C.

4. The method of claim 1, wherein the indium precursor comprises indium halide, indium nitrate, indium hydroxide, indium fluoride, indium chloride, indium bromide, indium iodide, indium oxide, indium sulfate, indium carboxylate, indium acetate, indium acetylacetonate, or a combination thereof.

5. The method of claim 1, wherein the zinc precursor comprises a Zn metal powder, an alkylated Zn compound, a Zn alkoxide, a Zn carboxylate, Zn nitrate, Zn chlorate, Zn sulfate, Zn acetylacetonate, a Zn halide, Zn cyanide, Zn hydroxide, Zn oxide, Zn peroxide, or a combination thereof.

6. The method of claim 1, wherein the gallium precursor comprises gallium chloride, gallium acetylacetonate, gallium fluoride, gallium oxide, gallium nitrate, gallium sulfate, gallium bromide, gallium iodide, or a combination thereof.

7. The method of claim 1, wherein the organic ligand is represented by $RCOOH$, $RNH_2$, $R_2NH$, $R_3N$, $RSH$, $RH_2PO$, $R_2HPO$, $R_3PO$, $RH_2P$, $R_2HP$, $R_3P$, $ROH$, $RCOOR'$, $RPO(OH)_2$, $RHPOOH$, $R_2POOH$, wherein, R and R' are independently a C1 to C24 aliphatic hydrocarbon, a C6 to C20 aromatic hydrocarbon, or a combination thereof.

8. The method of claim 1, wherein the quantum dot exhibits a first absorption peak of less than or equal to about 440 nanometers and an optical density at a wavelength of about 450 nanometers per gram of greater than or equal to about 1,100 in an ultraviolet-visible absorption spectrum.

9. The method of claim 1, wherein a maximum emission peak of the green light is in a range of about 500 nanometers to about 550 nanometers.

10. The method of claim 1, wherein the quantum dot has a ratio of intensity at a wavelength of about 450 nanometers relative to an intensity at a wavelength of about 350 nanometers of greater than or equal to about 0.5:1 in an ultraviolet-visible absorption spectrum.

11. The method of claim 1, wherein when a first absorption peak in an ultraviolet-visible absorption spectrum of the quantum dot is less than or equal to about 440 nanometers, the quantum dot has a mole ratio of phosphorus relative to a sum of indium, zinc, and gallium of greater than or equal to about 0.2:1 and less than about 0.77:1.

12. The method of claim 1, wherein when a first absorption peak in an ultraviolet-visible absorption spectrum of the quantum dot is less than or equal to about 440 nanometers, the quantum dot has a mole ratio of a sum of zinc and gallium relative to indium of less than about 0.75:1.

13. The method of claim 1, wherein a diameter of the multi-component core is greater than or equal to about 2.3 nanometers and less than or equal to about 3.0 nanometers.

14. The method of claim 1, further comprising:
forming a shell on the multi-component core of the quantum dot,
wherein the forming a shell on the multi-component core comprises
preparing a first mixture comprising a zinc precursor, an organic ligand, and an organic solvent;
adding the obtained multi-component core and a selenium-containing precursor to the first mixture to obtain a second mixture;
heating the second mixture up to a shell-forming temperature to obtain a third mixture that comprises third particles having a first semiconductor nanocrystal shell comprising zinc and selenium on the multi-component core; and
adding a sulfur-containing precursor to the third mixture at the shell-forming temperature and performing a reaction to form a second semiconductor nanocrystal shell comprising zinc and sulfur on the first semiconductor nanocrystal shell.

15. The method of claim 14, wherein the shell-forming temperature is greater than or equal to about 280° C.

16. The method of claim 14, wherein the selenium-containing precursor comprises selenium-trioctylphosphine (Se-TOP), selenium-tributylphosphine (Se-TBP), selenium-triphenylphosphine (Se-TPP), tellurium tributylphosphine (Te-TBP), or a combination thereof.

17. The method of claim 14, wherein the sulfur-containing precursor comprises hexane thiol, octane thiol, decane thiol, dodecane thiol, hexadecane thiol, mercapto propyl silane, sulfur-trioctylphosphine (S-TOP), sulfur-tributylphosphine (S-TBP), sulfur-triphenylphosphine (S-TPP), sulfur-trioctylamine (S-TOA), trimethylsilyl sulfur, ammonium sulfide, sodium sulfide, or a combination thereof.

18. The method of claim 14, wherein the quantum dot has a mole ratio of zinc relative to a sum of indium and gallium of greater than or equal to about 8:1 and less than or equal to about 45:1.

19. The method of claim 14, wherein the quantum dot has a mole ratio of a sum of indium and gallium relative to a sum of selenium and sulfur of greater than or equal to about 0.03:1 and less than or equal to about 0.15:1.

20. The method of claim 1, wherein the quantum dot has a quantum efficiency of greater than or equal to about 60% and has a full width at half maximum of less than or equal to about 50 nanometers.

* * * * *